United States Patent
Dao et al.

(10) Patent No.: US 9,595,847 B2
(45) Date of Patent: Mar. 14, 2017

(54) UNINTERRUPTED LITHIUM BATTERY POWER SUPPLY SYSTEM

(71) Applicant: Elite Power Solutions LLC, Chandler, AZ (US)

(72) Inventors: Yuan Dao, Phoenix, AZ (US); William Jeffrey Schlanger, Flagstaff, AZ (US)

(73) Assignee: Elite Power Solutions LLC, Chandler, AZ (US)

( * ) Notice: Subject to any disclaimer, the term of this patent is extended or adjusted under 35 U.S.C. 154(b) by 404 days.

(21) Appl. No.: 14/225,251

(22) Filed: Mar. 25, 2014

(65) Prior Publication Data

US 2014/0285022 A1    Sep. 25, 2014

Related U.S. Application Data

(63) Continuation-in-part of application No. 12/939,889, filed on Nov. 4, 2010, now Pat. No. 8,723,482, and a
(Continued)

(51) Int. Cl.
*H02J 7/00* (2006.01)
*H02J 9/00* (2006.01)
(Continued)

(52) U.S. Cl.
CPC .............. *H02J 9/061* (2013.01); *G01R 31/36* (2013.01); *H01M 10/441* (2013.01); *H02J 7/0016* (2013.01); *H02J 7/0021* (2013.01); *H01M 10/0525* (2013.01); *Y02E 60/122* (2013.01); *Y02T 10/7055* (2013.01); *Y10T 307/625* (2015.04)

(58) Field of Classification Search
CPC ..... G08B 21/00; H02J 7/04; H02J 7/00; H02J 7/0016; H02J 7/0021; H02J 9/061; H02J 9/00; G01R 31/36; G01R 31/00
USPC ........ 307/66, 64, 80, 43; 320/134, 116, 152, 320/109; 340/664, 666, 667; 702/62, 63, 702/58
See application file for complete search history.

(56) References Cited

U.S. PATENT DOCUMENTS 4,673,826 A    6/1987 Masson
5,019,717 A    5/1991 McCurry et al.
(Continued)

*Primary Examiner* — Fritz M Fleming
*Assistant Examiner* — Jagdeep Dhillon
(74) *Attorney, Agent, or Firm* — Invention To Patent Services; Alex Hobson

(57) ABSTRACT

An uninterrupted power supply system incorporates a plurality of lithium batteries as a back-up power supply to an AC power supply. In the event that there is an interruption in the AC power supply, a power output switch is automatically activated by a power control system to draw power from a lithium battery pack. In an embodiment, a battery pack is monitored by a battery management system that is coupled to battery monitoring modules couple to each battery. The battery management system may be configured to monitor the voltage and/or temperature of each battery. In another embodiment, an uninterrupted power supply system comprises a battery unit balancing system that maintains each battery within a battery unit below a threshold voltage value. A charging circuit and discharging circuit are used to maintain the batteries in a ready state of charge when not being used for the output power.

22 Claims, 25 Drawing Sheets

Related U.S. Application Data continuation-in-part of application No. 13/077,136, filed on Mar. 31, 2011, now Pat. No. 9,000,935.

(51) Int. Cl.
| | | |
|---|---|---|
| *H02J 9/06* | (2006.01) | |
| *G01R 31/36* | (2006.01) | |
| *H01M 10/44* | (2006.01) | |
| *H01M 10/0525* | (2010.01) | |

(56) References Cited

U.S. PATENT DOCUMENTS

| | | |
|---|---|---|
| 5,021,679 A | 6/1991 | Fairbanks et al. |
| 5,532,523 A | 7/1996 | Tang |
| 5,578,876 A | 11/1996 | Crampton |
| 5,602,462 A | 2/1997 | Stich et al. |
| 5,721,933 A | 2/1998 | Walsh et al. |
| 5,994,794 A | 11/1999 | Wehrlen |
| 6,406,806 B1 | 6/2002 | Keshula et al. |
| 7,535,201 B2 | 5/2009 | Nakazawa |
| 7,944,182 B2 | 5/2011 | Beg et al. |
| 8,219,333 B2 | 7/2012 | Li |
| 8,258,747 B2 | 9/2012 | Andres et al. |
| 2001/0045779 A1 | 11/2001 | Lee et al. |
| 2004/0164712 A1 | 8/2004 | Lin et al. |
| 2004/0249534 A1 | 12/2004 | Yamada et al. |
| 2006/0005055 A1 | 1/2006 | Potega |
| 2007/0176604 A1 | 8/2007 | Morimoto |
| 2008/0018300 A1* | 1/2008 | Zaag ............... H02J 7/0019 320/118 |
| 2008/0174278 A1 | 7/2008 | Masias et al. |
| 2008/0278006 A1 | 11/2008 | Gottlieb et al. |
| 2009/0195217 A1* | 8/2009 | Choi ............... B60K 6/28 320/152 |
| 2010/0052614 A1* | 3/2010 | Mariels ............ H02J 7/0016 320/116 |
| 2011/0014501 A1* | 1/2011 | Scheucher ........ B60K 1/04 429/7 |
| 2011/0140650 A1 | 6/2011 | Zhang et al. |
| 2011/0140667 A1 | 6/2011 | Moon |
| 2011/0234231 A1 | 9/2011 | Liu et al. |
| 2011/0279087 A1 | 11/2011 | Andres et al. |
| 2011/0298626 A1* | 12/2011 | Fechalos .......... H01M 10/482 340/664 |
| 2012/0319658 A1 | 12/2012 | White et al. |

\* cited by examiner

Output Turns on With Alarm
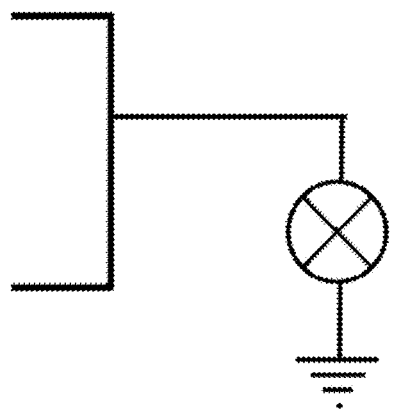
Output Turns off With Alarm
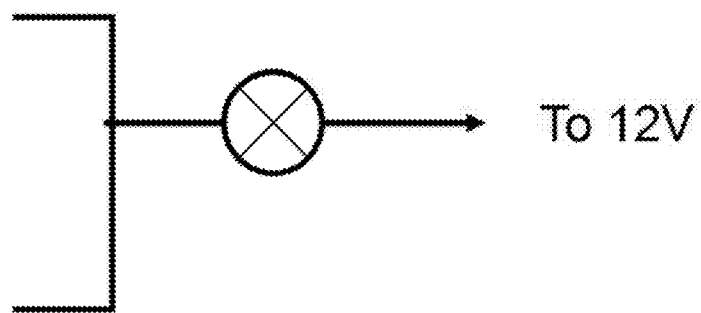
FIG. 15

UNINTERRUPTED LITHIUM BATTERY POWER SUPPLY SYSTEM

CROSS REFERENCE TO RELATED APPLICATIONS

This application is a continuation in part of U.S. patent application Ser. No. 12/939,889 entitled Battery Unit Balancing System filed on Nov. 4, 2010 currently allowed and U.S. patent application Ser. No. 13/077,136 entitled Battery Management System filed on Mar. 31, 2011 and currently pending, both of which are incorporated by reference herein.

BACKGROUND OF THE INVENTION

Field of the Invention

The present invention relates to uninterrupted lithium battery power supply systems and methods of using said system, in one embodiment, a battery management system is configured to monitor the state of charge of a battery unit. In another embodiment, a system and method for automatically balancing a battery unit is provided. In particular, a battery balancing system may activate a discharging circuit that draws a constant discharging current from a battery unit when the voltage of a battery within the battery unit exceeds a predetermined threshold.

Background

Lithium ion batteries require special controls in back-up power systems, —as they require monitoring of their state of charge to ensure that they are not operated below a threshold voltage value and/or are not over charged. Lithium batteries can be irreversibly damaged if operated below a threshold voltage value. Lithium batteries may lose their ability to be fully charged if they are operated below a threshold voltage for too long. A plurality of lithium batteries would be required to generate the voltage needed for most uninterrupted power supply systems and therefore a plurality of lithium batteries may need to be connected in series. When a plurality of batteries are coupled together, it is important to keep the level of charge of each battery within a range of the other batteries to prevent damage and to get maximum capacity.

As shown in FIG. 1, lithium batteries have a non-linear discharge profile, with a relatively flat discharge region up to about 80% discharged. Therefore, a small change in voltage can mean a large difference in the state of charge, unlike a lead acid battery that has a relatively linear drop in voltage as the battery is discharged. The state of charge of a lead acid battery, and therefore the amount of power remaining, is more easily monitored by a UPS system by simply monitoring the voltage of the lead acid battery. The amount of power remaining in a lithium battery system is more difficult to monitor and predict however by simply measuring voltage. It would therefore be more difficult to determine the available power remaining in a lithium battery unit by simply measuring the voltage.

Current battery management systems obtain data about individual batteries in a battery unit. The systems reserve addresses for communication with battery unit sensors and/or battery units. When sensors transmit data about battery units to the management system, the sensors include the address of the battery unit. Such a system may require significant amounts or resources and complex arrangements for connecting the components of the system.

Current charging systems are configured to charge a battery pack to a predetermined voltage. However, the individual battery may not be charged to the same level, and the discrepancy between the batteries state of charge levels can cause capacity to be limited. The battery pack capacity is limited to the capacity of the lowest battery unit. Additionally, when some battery units have lower state-of-charge levels, as the battery discharges, those units may discharge to a level resulting in permanent loss of charging capacity.

SUMMARY OF THE INVENTION

The invention is directed to an uninterrupted, power supply system, UPS system, that incorporates a plurality of lithium batteries as a back-up power supply to an AC power supply. In the event that there is an interruption in the AC power supply, a power output switch is automatically activated by a power control system to draw power from a lithium battery unit. In an exemplary embodiment, a battery unit is monitored by a battery management system that is coupled to battery monitoring modules coupled to each battery in the battery unit. The battery management system may be configured to monitor the voltage and/or temperature of each battery in the battery unit. In another exemplary embodiment, an uninterrupted power supply system comprises a battery unit balancing system that maintains each battery within a battery unit below a threshold voltage value.

An uninterrupted power supply system, as described herein, may comprise a data transmission system to provide data regarding the system to remote or alternative locations, such as to a central control or monitoring system. A data transmission system may use any suitable means to transfer power supply system data to a separate location including, a wired connection or a wireless transmitter. A control or monitoring center may be alerted if an uninterrupted power supply system has a fault or alert of any kind, including a battery unit or battery being above or below a threshold voltage, a battery being at too high of a temperature, a loss of AC power, a discharge threshold of a battery unit and the like. In addition, other system parameters may be provided to a remote location including, but not limited to, power output parameters, power output source battery unit voltage state, individual battery voltage state, individual battery temperature and any of these values as a function of time. A MODBUS or any other data communication protocol may be used to transmit system parameters through to a remote location.

An uninterrupted lithium battery power supply system, as described herein, comprises a plurality of lithium batteries. Any suitable number of batteries maybe configured in a battery unit or battery pack including, but not limited to, two or more, three or more, four or more, six or more, to or more, twenty or more and any range between and including the quantities provided. Power is drawn from a battery pack and a battery pack may comprise any number of battery units. A battery omit comprises two or more lithium batteries that may be configured in series or in parallel. In an exemplary embodiment, a battery pack comprises MO battery units, each battery unit comprising four lithium batteries in series. Each lithium battery may be maintained in a stand-by condition, or charge of approximately 3.375 volts, for example, to ensure an output voltage of 3.0 volts per battery on average when the battery pack is required for back-up power. This battery pack, having a ready voltage of 27 volts, may be used in an uninterrupted power supply system that is configured to provide a 24V output, for example. The power output regulator, of this example uninterrupted power supply system, may regulate the power delivered to any suitable voltage, such as 24V, thereby ensuring a constant and steady power supply.

A lithium battery, as used herein, comprises lithium metal or lithium compounds in the anode. Lithium batteries have a very high charge density or long life, and can operate at temperature extremes. The lifetime of a lithium battery may be as much as ten times greater than a lead-acid battery. In addition, lead-acid batteries have a somewhat limited effective operating temperature range. Lithium batteries can produce voltages from 1.5 to 3.7V.

The uninterrupted lithium battery power supply system comprises a power control system that is configured to monitor power supply systems and control the supply of output power. An exemplary power control system comprise a battery power input and an AC power input, whereby leads from a battery pack and an AC power supply can be connected, respectively. An exemplary power control system may also comprise an AC power supply sensor that is configured to monitor the incoming AC power. In the event that the AC power supply is interrupted, such as a substantially reduction or loss of power, the power control system may automatically switch output power from the AC power input to battery power supply. A power output switch may be controlled by a computing device that monitors the system by receiving input data and utilizing control programs for operating the system. A signal may be sent to the computing device in the event that an AC power supply sensor registers a toss or significant drop in incoming AC power. The computing device may then send a signal to the power output switch to change the output power supply from AC power to battery power. Output power may be delivered by the battery pack until a low voltage threshold is reached by a battery unit, or individual battery within the battery pack, or when the battery pack drops below a threshold voltage. In the event that incoming AC power is restored while output power is being delivered by a battery pack, the control unit or computing device may direct the power output switch to revert back to AC power for the output power delivery. The battery pack may then begin to be charged back to a full voltage state. An exemplary power control system may also comprise a power output regulator that regulates a supplied power, either from batteries or from AC power, to a lower level, thereby ensuring that a more consistent output power supply is provided. For example, the power supplied by an AC power supply and battery unit may be 27 volts and the power output regulator may regulated the output power to 24 volts, thereby providing a buffer in the event that there are slight variations in incoming or provided power. An exemplary power control system may also comprise a power output connector, such as a plug, whereby an external device requiring an electrical power supply can be connected. Any number of power output connectors may be configured on a power control system, such as one, two, three, five, more than five and the like.

The uninterrupted lithium battery power supply system is configured to provide an uninterrupted power output. The uninterrupted power output is provided in part by an AC power supply connected to an AC power input, and in part by a battery pack, in one embodiment, the output power is provided by the AC power supply and when this AC power supply is interrupted the power control system may switch power supply to a battery pack A battery monitoring module is coupled to each of the batteries for direct monitoring of battery status data, such as voltage and in some cases temperature of the battery, and may comprise a shunt and a thermistor. A battery monitoring module may comprise an analog-to-digital converter that measures a voltage of said batteries. In an exemplary embodiment, a battery monitoring module is connected between a positive and negative terminal of a battery and is physically located on the battery. A module connector may couple a first battery monitoring module to a second battery monitoring module. In embodiments with a larger number of individual batteries in a battery unit, a plurality of module connectors may be configured in a daisy-chain from one battery to the next.

A physical cable may be coupled between the battery monitoring module and the battery data input for the transfer of data and requests. In an alternative embodiment, a wireless transmitter may transmit a request for data or send data, and a wireless receiver may be configured for receipt of this information. For example, a wireless transmitter may be coupled with the computing device and may send a request for battery monitoring module data. A wireless receiver coupled with a first battery monitoring module may receive this request and may then send data about the first battery and/or battery unit to the battery data input through a wireless transmitter. Again, a wireless signal receiver may be coupled with the battery data input to provide this data to the computing device. Any suitable configuration of wireless receivers and transmitters may be used to reduce the number of physical connections between a battery pack and a power control system.

A battery management system may be coupled to the battery monitoring modules for obtaining data about the batteries in a battery pack or battery unit. A computing device may obtain the battery data by sending a data request to the first monitoring module. The first monitoring module obtains and transmits data about its connected battery to the computing device and sends a data request to the second monitoring module. The second monitoring module obtains and transmits data about its connected battery to the computing device and sends a data request to the next monitoring, module. Each successive monitoring module performs the same steps until all the monitoring modules have sent data about their respective battery to the computing device. Therefore, the computing device needs solely a data request port and input data pmts) to obtain the data for an entire battery unit or battery pack. A module connector may be couple from one battery unit to a second battery unit, for example.

In an exemplary embodiment, a first battery monitoring module is configured to, in response to a data request from the computing device, transmit data of a first lithium battery to a battery data input. Subsequently, the first battery monitoring module transmits a data request to a second battery monitoring module through a module connector. The second battery monitoring module is configured to, in response to the data request from the first battery monitoring module, transmit data of said second lithium battery to the battery data input of the computing device. This process may be repeated for a third and an subsequent batteries in a battery pack. Thereby, data about each battery unit including voltage and temperature for example, is provided to the computing device in a very efficient manner. A battery data input may be coupled to a battery monitoring module through a cable or wirelessly. A battery data input may comprise a wireless signal receiver that is configured to receive a wireless signal having battery unit parameter data. A wireless signal generator may be coupled with a battery monitoring module. Likewise a data request output may comprise a wireless signal generator that is received by a wireless signal receiver of a battery monitoring module.

In an exemplary embodiment, the computing device is configured to transmit a second data request to the battery monitoring module coupled to the first lithium battery, alter the computing device has not received a data input through the battery data input for a predetermined period of time. A second data request may be initiated after a preset amount of time of not receiving any data input, such as a fraction of a second.

A battery management system, as described herein, comprises a battery data input coupled with said battery monitoring modules, and computing device coupled with a data request output, and the data input. In an exemplary embodiment, a battery management system comprises a charging circuit coupled with the batteries or battery units to provide a chanting current from said. AC power input when a voltage of one of said batteries or battery units drops below a threshold value. A threshold value may be input during instillation by an operator of the system or at the manufacturer prior to delivery and may be stored by the computing device. A threshold value may be 3.2V or more, 3.3V or more, 3.4V or more 3.5V or more and any value between and including the threshold values provided.

An uninterrupted power supply system, as described herein, may comprise a battery balancing system as described in U.S. patent application Ser. No. 12/939,889 entitled Battery Unit Balancing System, to Dr. Dao, which is hereby incorporated by reference herein in its entirety. In an exemplary embodiment, a battery unit balancing system comprises a discharging circuit configured for connection to a battery unit. This discharging circuit comprises a voltage dividing circuit and a comparator circuit comprising a shunt regulator configured in parallel with the voltage dividing circuit. The discharging circuit may further comprise one or more current source circuits having a regulator and output device. The output device, shunt regulator and one or more current source circuits may be connected in parallel with the battery unit, wherein, while connected to the battery unit, the discharging circuit is configured for automatic activation. Automatic activation means that when a voltage of the battery unit exceeds a predetermined threshold, the discharging circuit draws a constant discharging current from the battery unit until the voltage of the battery unit falls below the predetermined, threshold. The voltage dividing circuit may be connected to the comparator circuit via a node to the shunt regulator, and the shunt regulator may be connected to the current source circuit via a current limiting resistor of the output device. The comparator circuit may be automatically activated to conduct when the voltage of the battery unit exceeds the predetermined threshold. The voltage dividing circuit is programmed to generate a predetermined voltage, wherein the predetermined voltage activates the one or more current source circuits via the comparator circuit, and whereby each current source circuit of the one or more current source circuits is configured such that a substantially stable current flows independent of the voltage of the battery unit. The voltage dividing circuit may comprise one or more resisters that are programmed to generate the predetermined voltage.

In an exemplary embodiment, an uninterrupted power supply system, comprises a program to determine the state of charge of a battery unit or battery, or the amount of available charge remaining. The calculation takes into account the battery unit or pack voltage prior to the utilization of battery power as the output power. The program utilizes input related to the power being drawn by the powered device, such as current, voltage and time, and calculates the total power usurped from the battery pack. The program can then calculate the discharge percent of the battery pack, as depicted in FIG. 1. A power control system may calculate the time remaining before the battery pack is discharged 80% and may send an alert via a data transmission system of the remaining time before shut-down. A power control system may shut-down the battery pack if a discharge level of 80% or more is reached, for example, in an effort to protect the system and prevent damage to the battery pack.

An uninterrupted power supply system, as described herein, may be configured or programmed to send a signal via the data transmission system to an external device. For example, a phone call, text message, email alert, or any other suitable signal, such as a signal configured to be received by a monitoring station, may be sent when an error, limit value or emergency level value is detected. For example, a battery monitoring module may measure and monitor temperature of individual batteries and may detect a temperature above a threshold or emergency limit set in the computing device. When the computing device receives this data, a signal may be sent via the data transmission system regarding the over-temperature condition. The uninterrupted power supply system may be configured to send a special signal in the event of any out of limit condition detected including, a high voltage condition, low voltage condition, high current condition, low current condition, high temperature condition, loss of AC power, loss of output power or a connection fault condition. An uninterrupted power supply system, as described herein, may be configured to shut off battery charging when the computing device detects a high voltage condition on a battery or battery unit. In another embodiment, an uninterrupted power supply system, as described herein, may be configured to discontinue power draw from a battery unit in the event of a low voltage condition.

A method for providing uninterrupted power utilizing an uninterrupted lithium battery power supply system, as described herein is provided. Any of the various embodiments described for the uninterrupted lithium battery power supply system may be used in the method. A method includes the steps of:
 a. providing an uninterrupted lithium battery power supply system, as described herein;
 b. connecting said battery unit to said battery power input;
 c. connecting an AC power supply to said AC power input;
 d. connection an electrical device to said power output connector;
 e. charging said first and second lithium batteries;
whereby said uninterrupted lithium battery power supply system is configured to provide an uninterrupted power output; whereby said uninterrupted power output is provided by an AC power supply connected to said AC power input and, when there is an interruption in said AC power supply, by said battery unit; and whereby said power control system controls said power output switch to draw power from said battery unit when an interruption in said AC power supply is detected by said AC power supply sensor.

The summary of the invention is provided as a general introduction to some of the embodiments of the invention, and is not intended to be limiting. Additional example embodiments including variations and alternative configurations of the invention are provided herein.

BRIEF DESCRIPTION OF THE DRAWINGS

The accompanying drawings are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
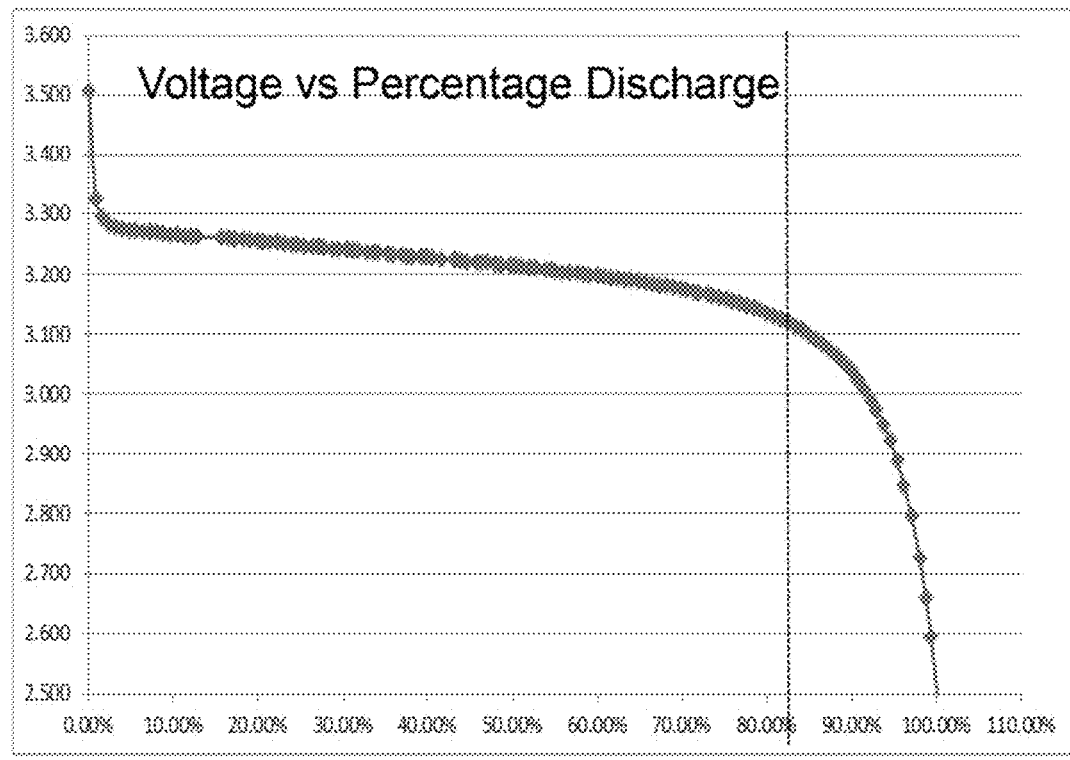

FIG. 1 shows an exemplary discharge profile for a lithium battery.

Figure 2:
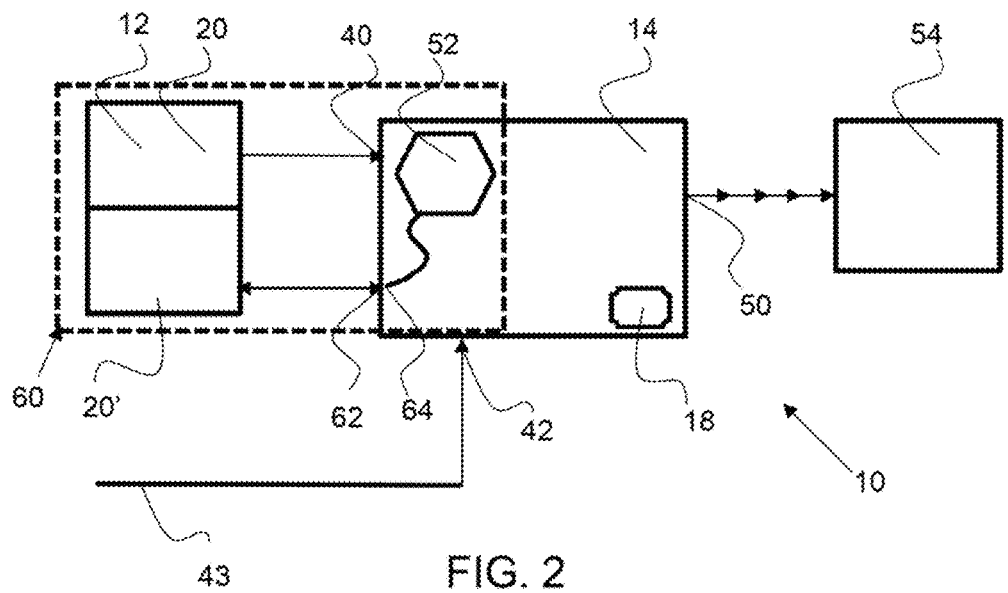

FIG. 2 shows a diagram of an exemplary uninterrupted lithium battery power supply system.

Figure 3:
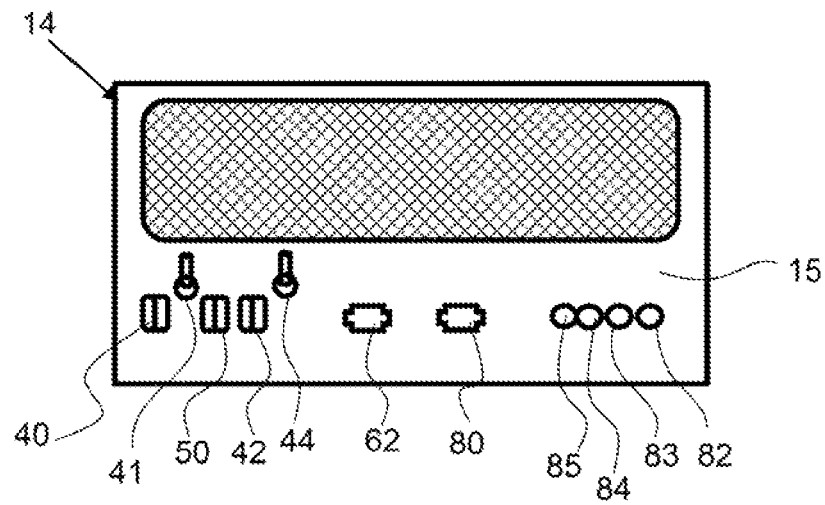

FIG. 3 shows an exemplary power control system and a plurality of input, outputs and indicators.

Figure 4:
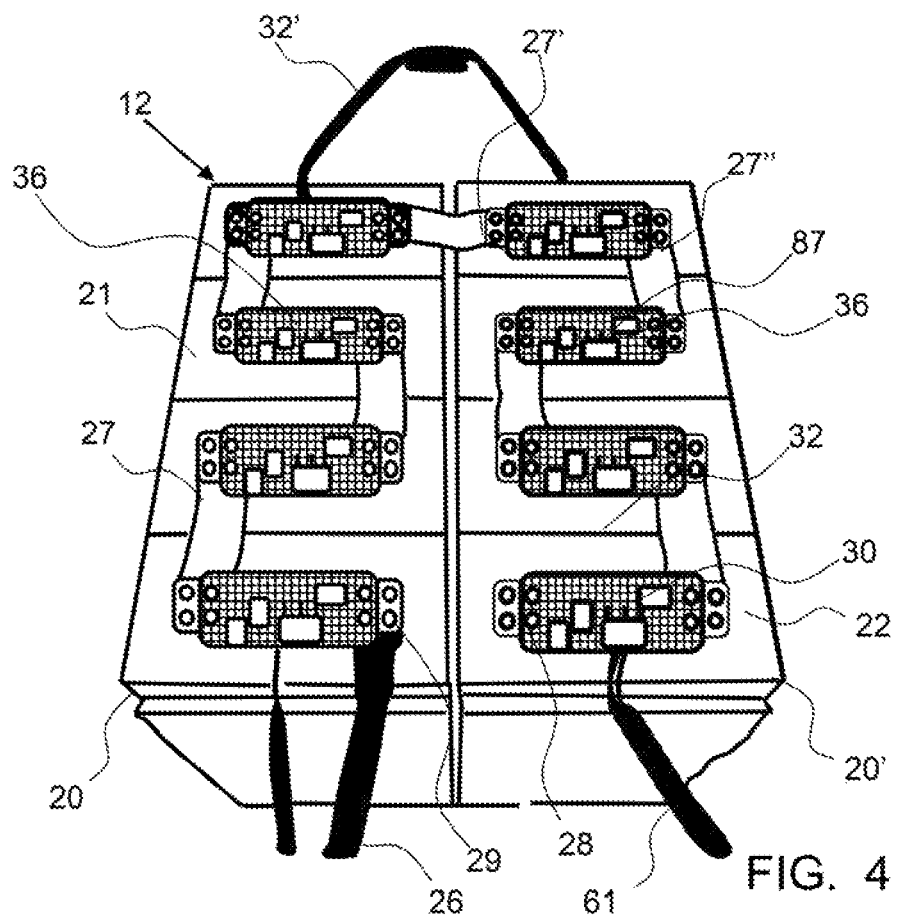

FIG. 4 shows an top-down view of an exemplary battery pack with battery monitoring modules configured thereon.

Figure 5:
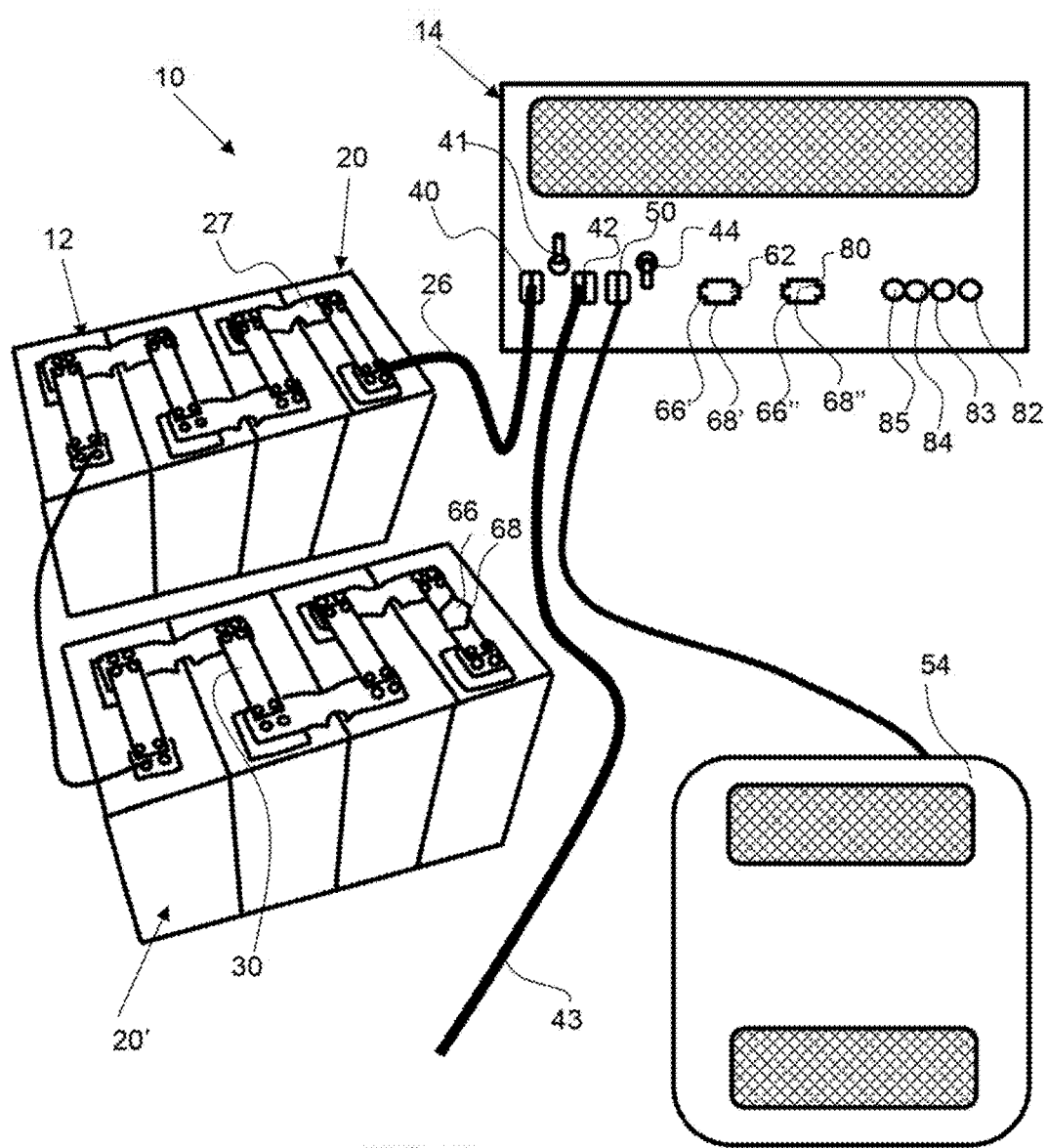

FIG. 5 shows diagram of an exemplary uninterrupted lithium battery power supply system.

Figure 6:
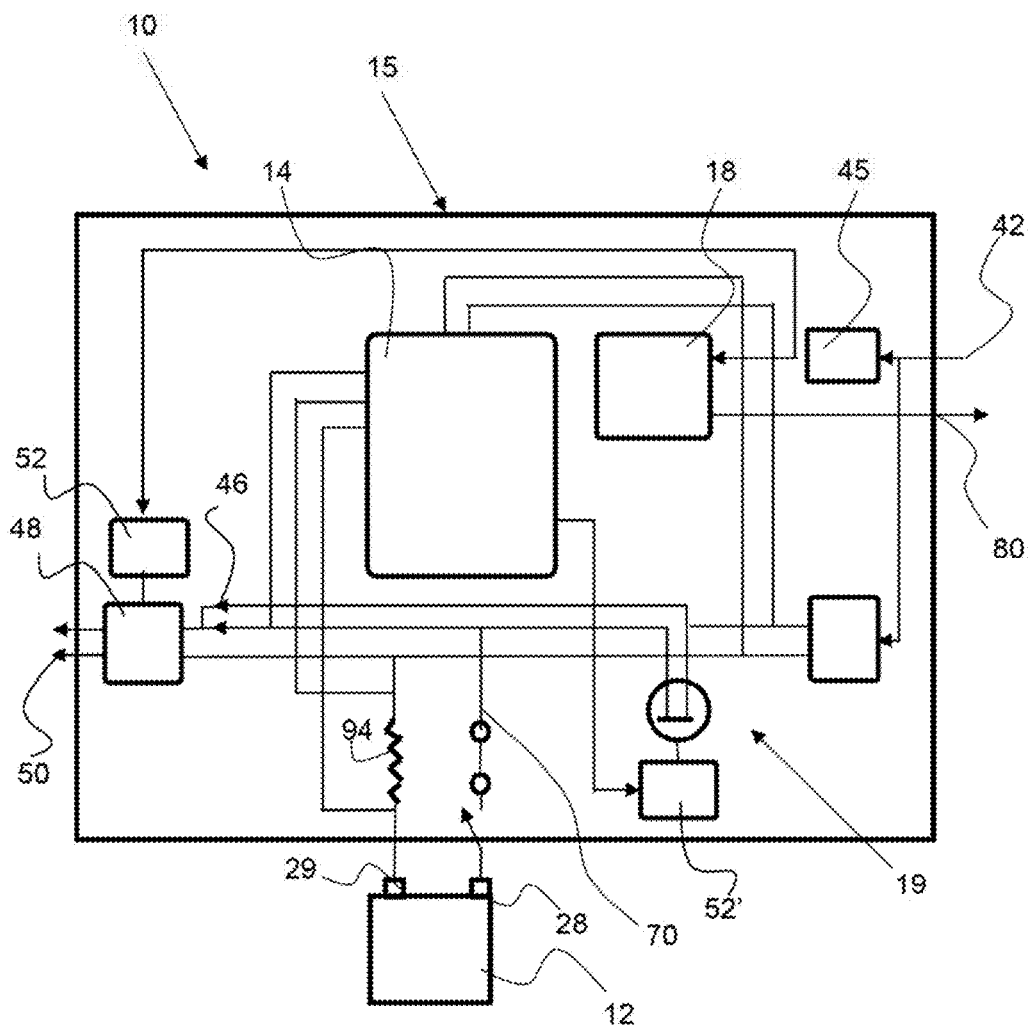

FIG. 6 shows a diagram of an exemplary uninterrupted lithium battery power supply system.

Figure 7:
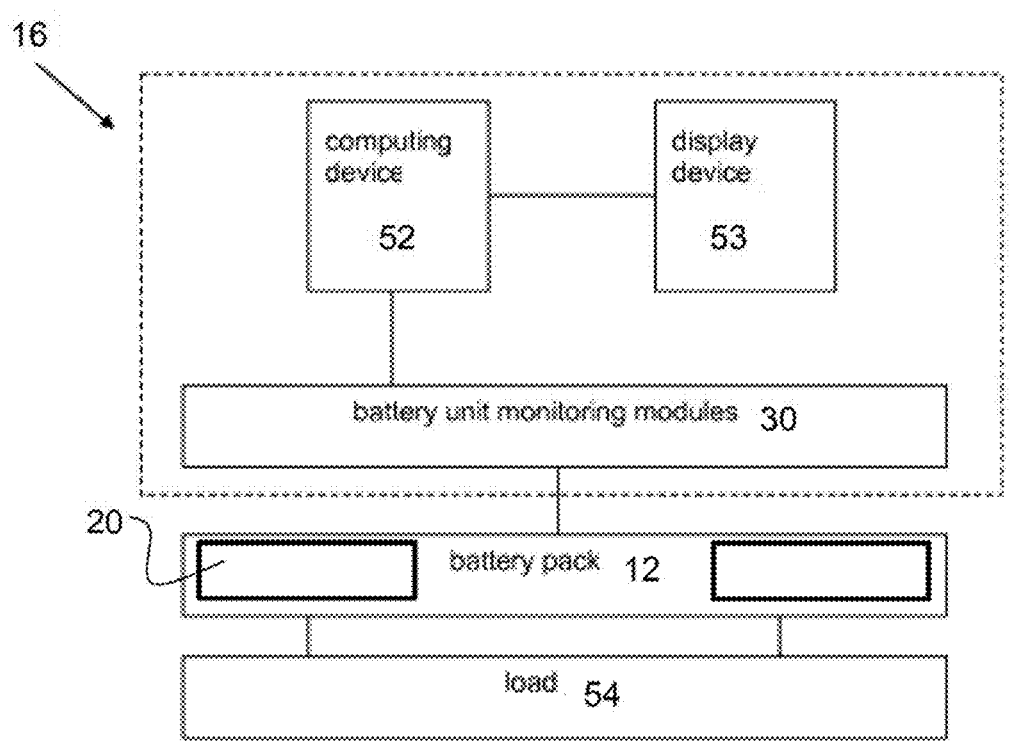

FIG. 7 shows a block diagram depicting an exemplary embodiment of a battery management system connected to a battery pack.

Figure 8:
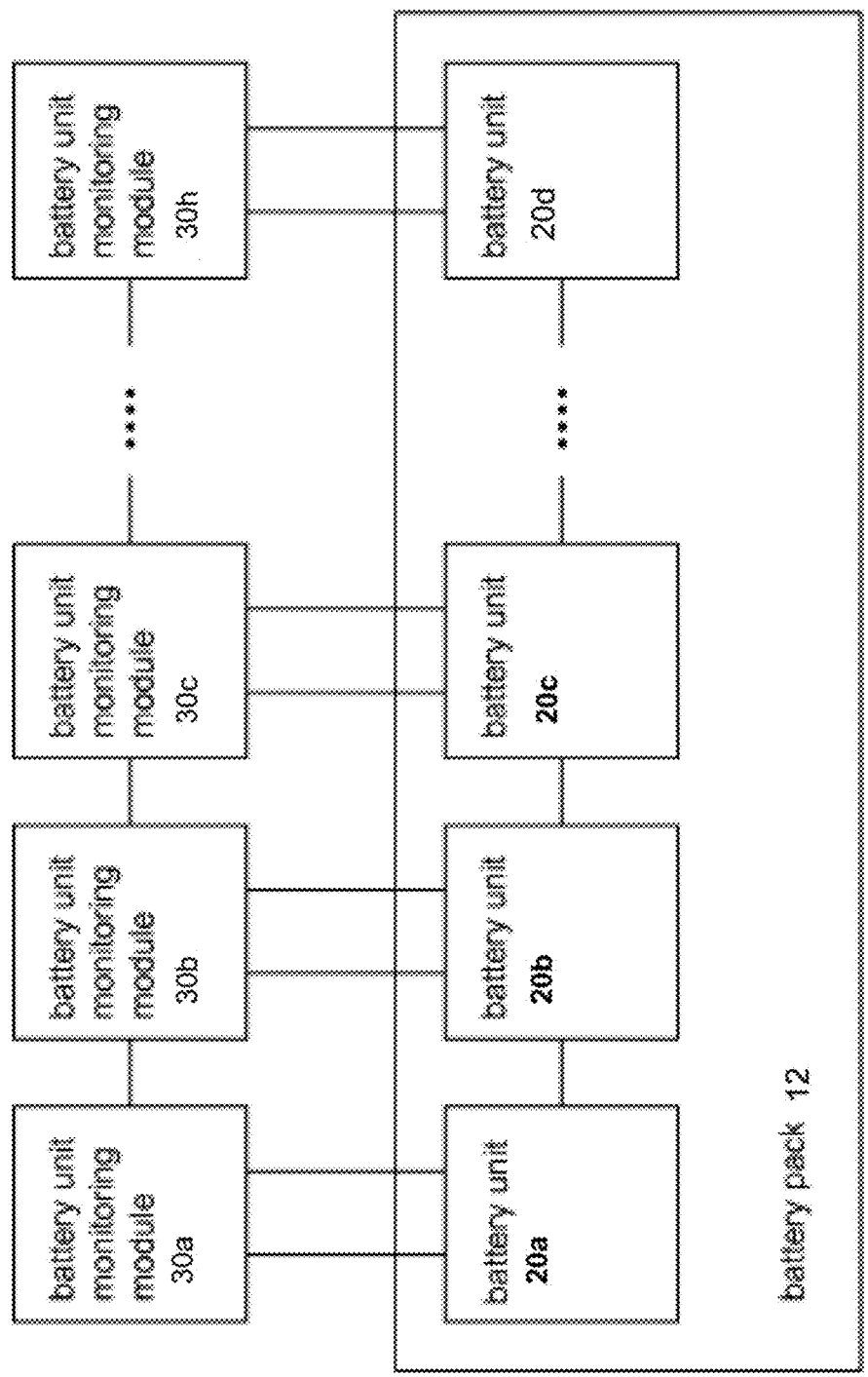

FIG. 8 shows a block diagram depicting an exemplary arrangement of battery unit monitoring modules of the battery management system with respect to the battery units of the battery pack.

Figure 9:
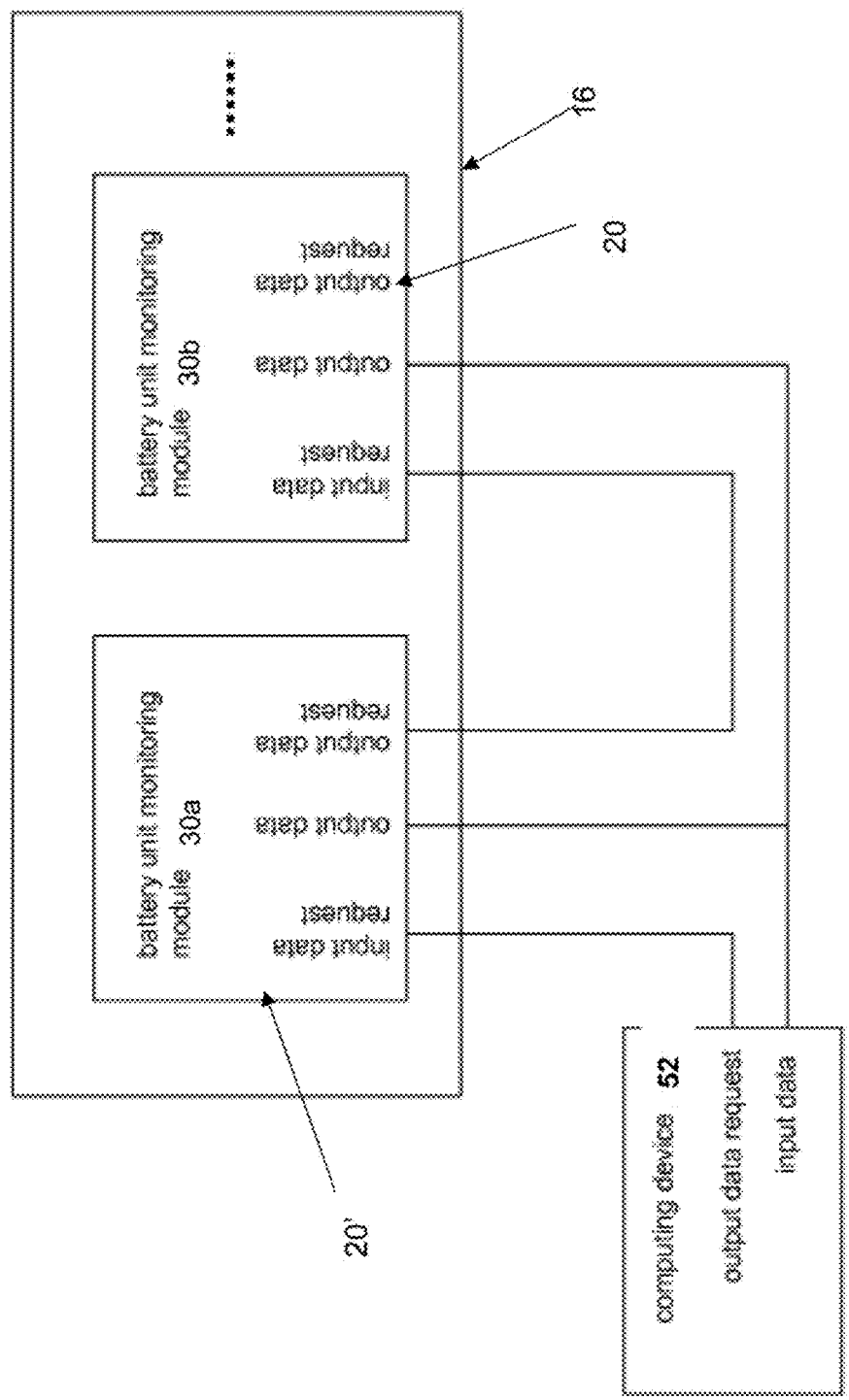

FIG. 9 shows a block diagram depicting connections within the battery management system between the computing device and the battery unit monitoring modules.

Figure 10:
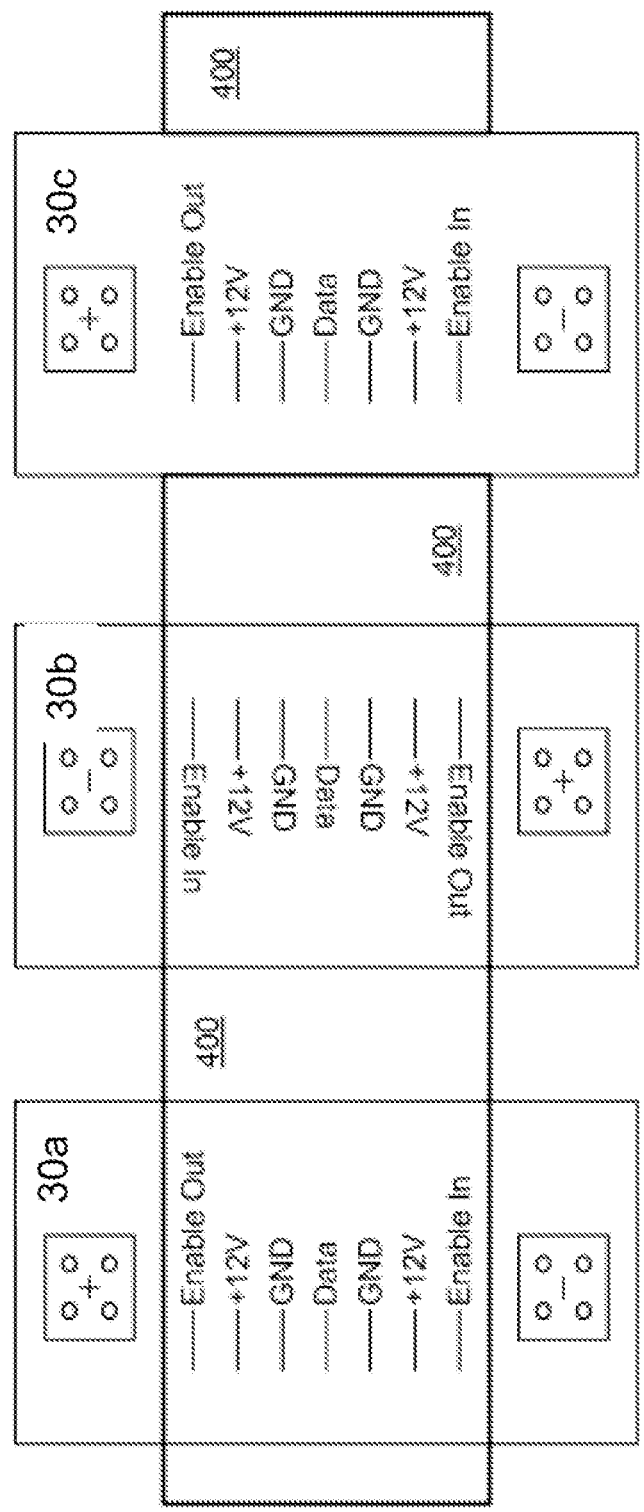

FIG. 10 shows a diagram depicting connections between battery unit monitoring modules.

Figure 11:
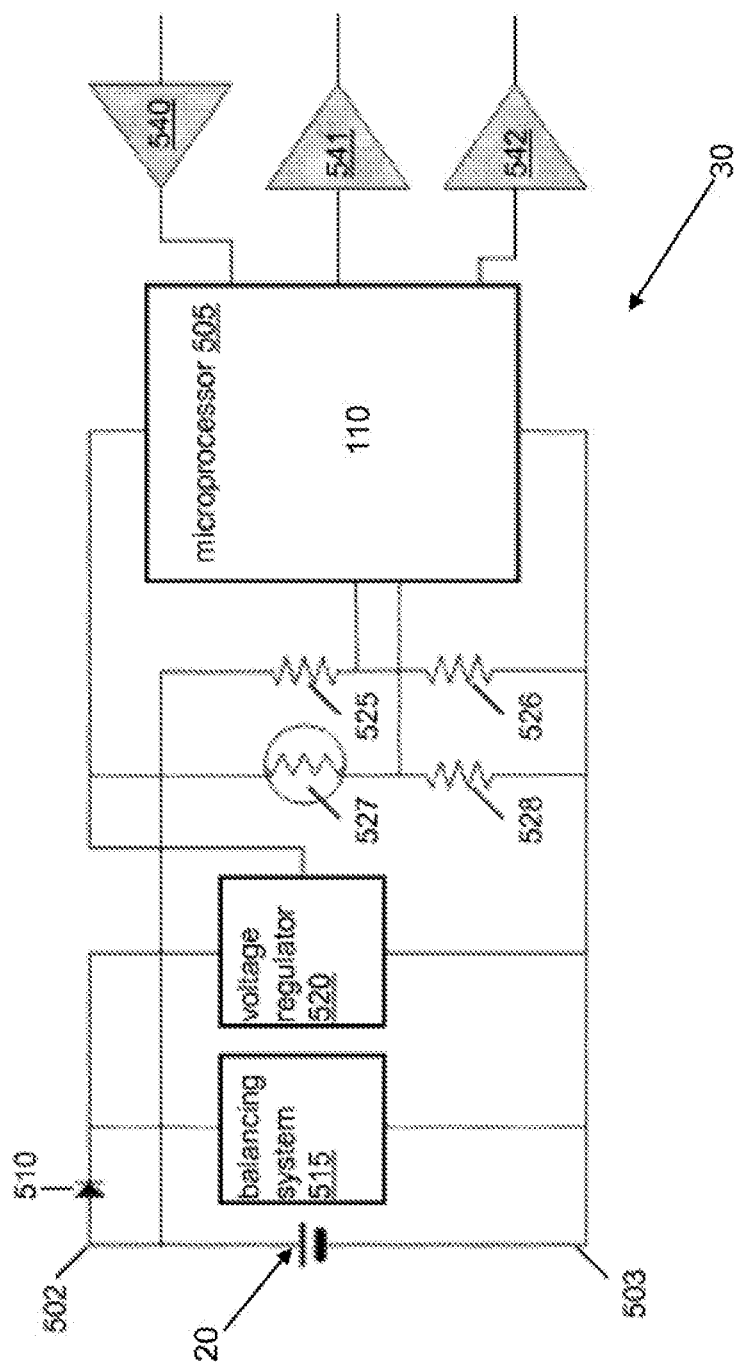

FIG. 11 shows a hybrid block and circuit diagram depicting an exemplary battery unit monitoring module.

Figure 12:
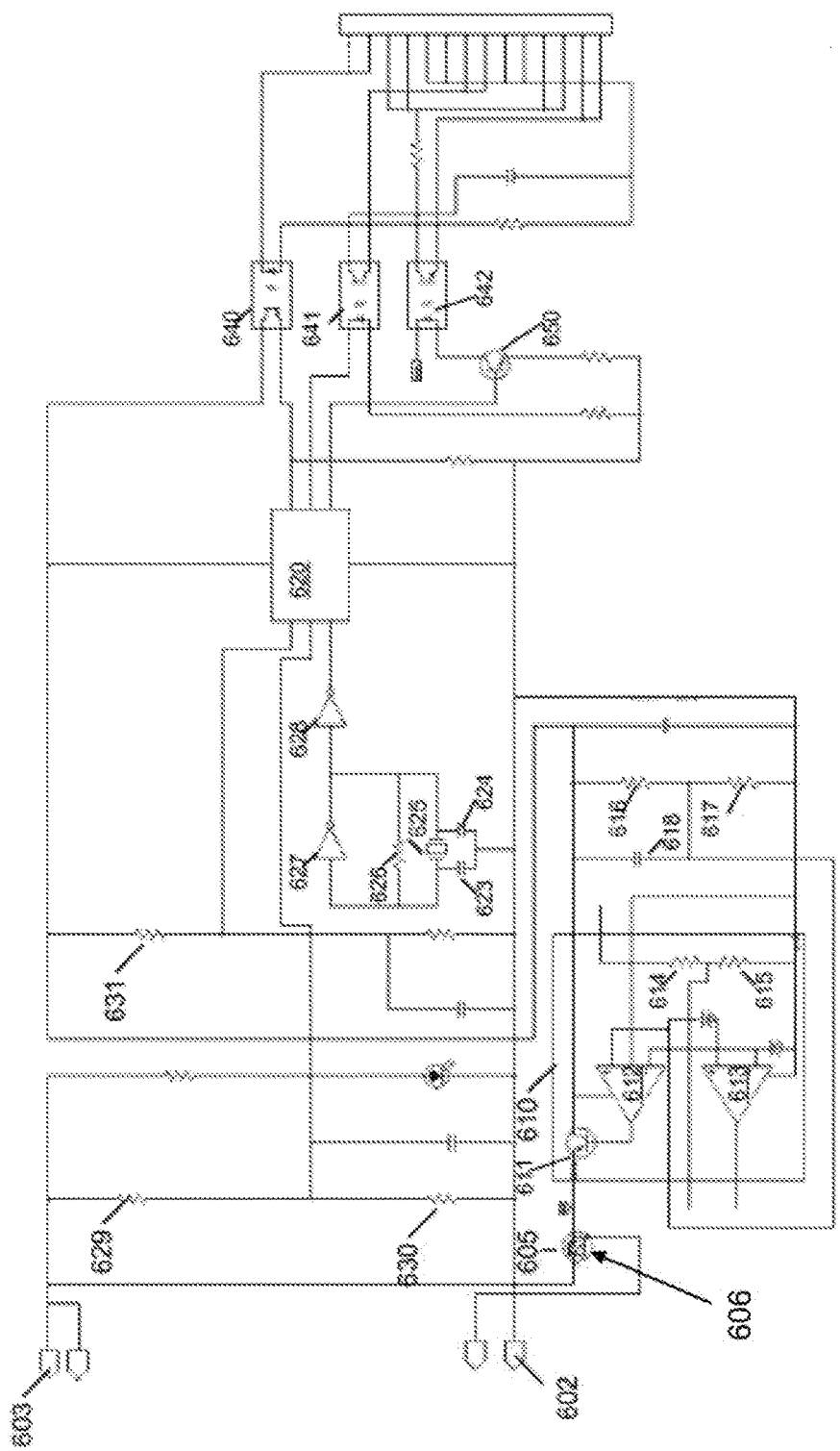

FIG. 12 shows a circuit diagram of an exemplary embodiment of a battery unit monitoring module.

Figure 13:
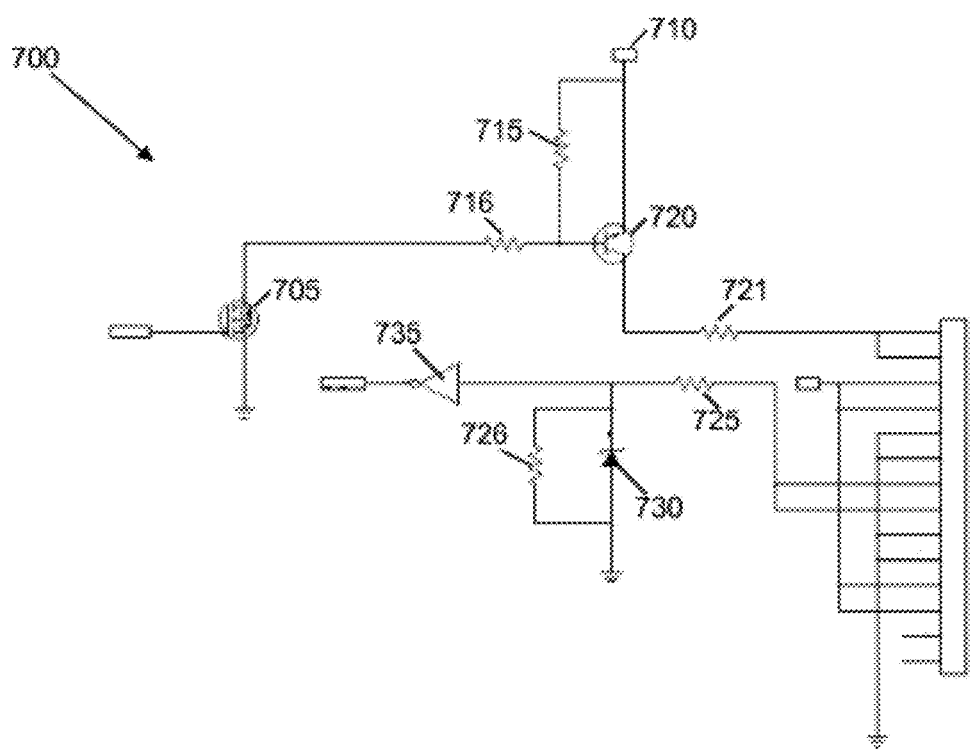

FIG. 13 shows a circuit diagram of an exemplary embodiment of the interface for a computing device.

Figure 14:
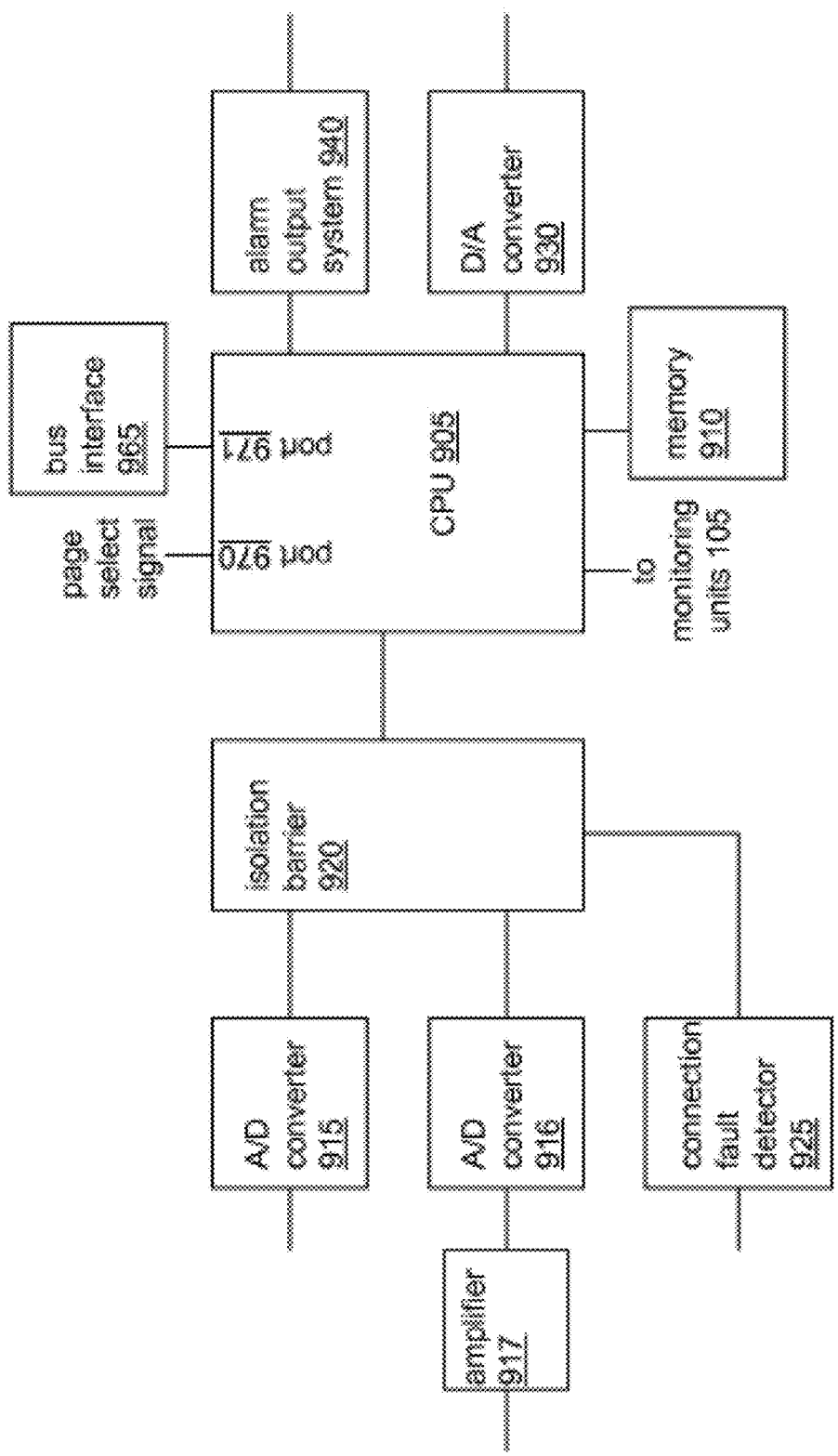

FIG. 14 shows a block diagram depicting an exemplary embodiment of the computing device of the battery management system.

FIG. 15 shows a block diagram depicting an exemplary embodiment of the alarm output system of the computing device.

Figure 16:
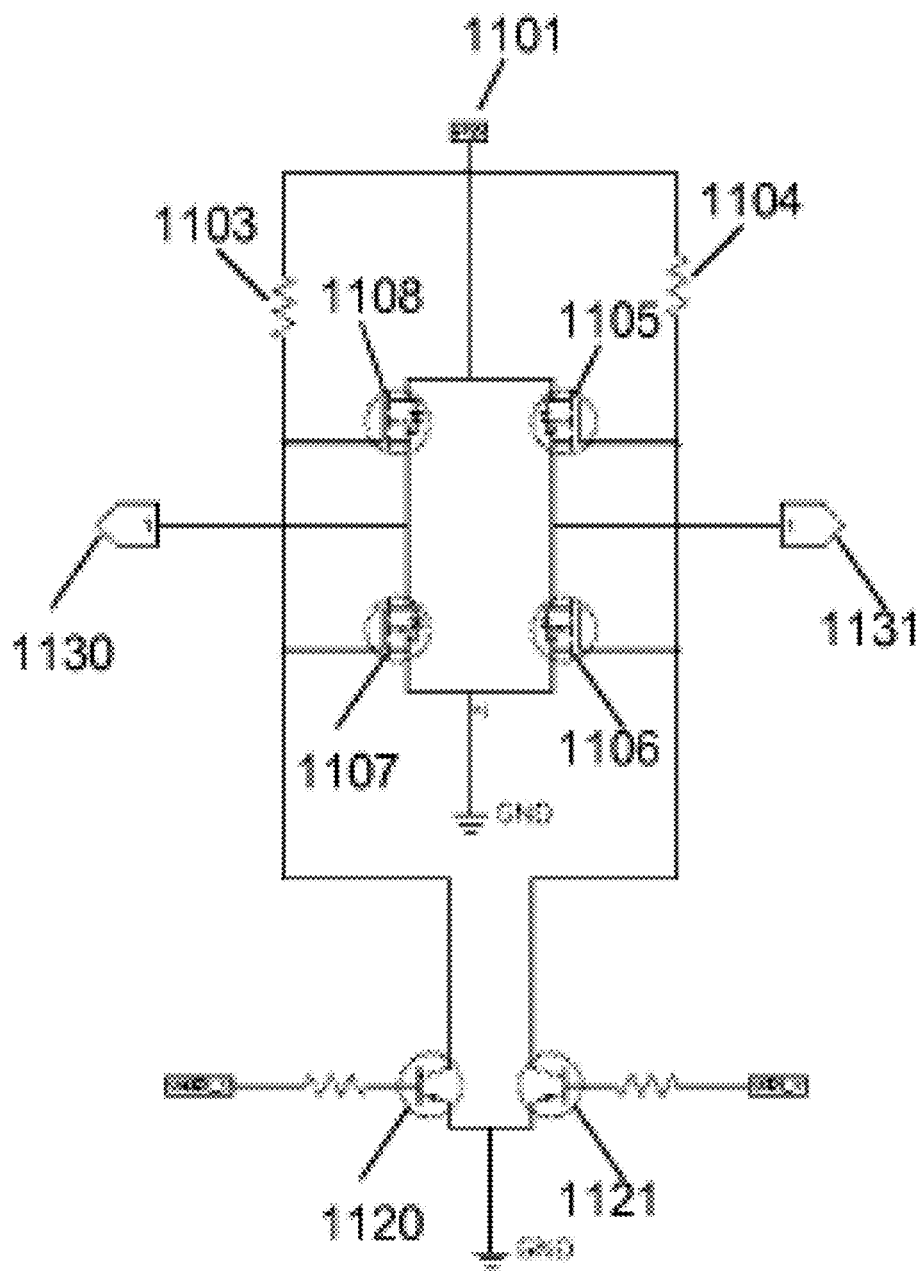

FIG. 16 shows a circuit diagram depicting an exemplary embodiment of the alarm output system of the computing device.

Figure 17:
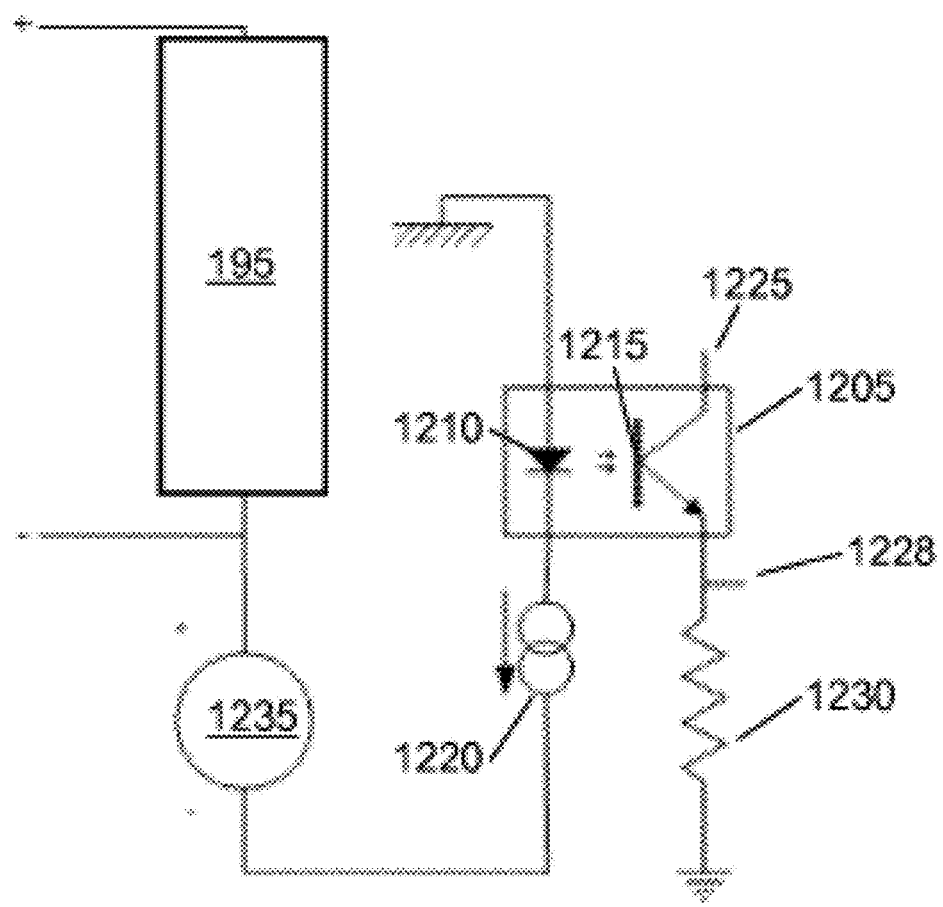

FIG. 17 shows a block diagram depicting an exemplary embodiment of the connection fault detection system of the computing device.

Figure 18:
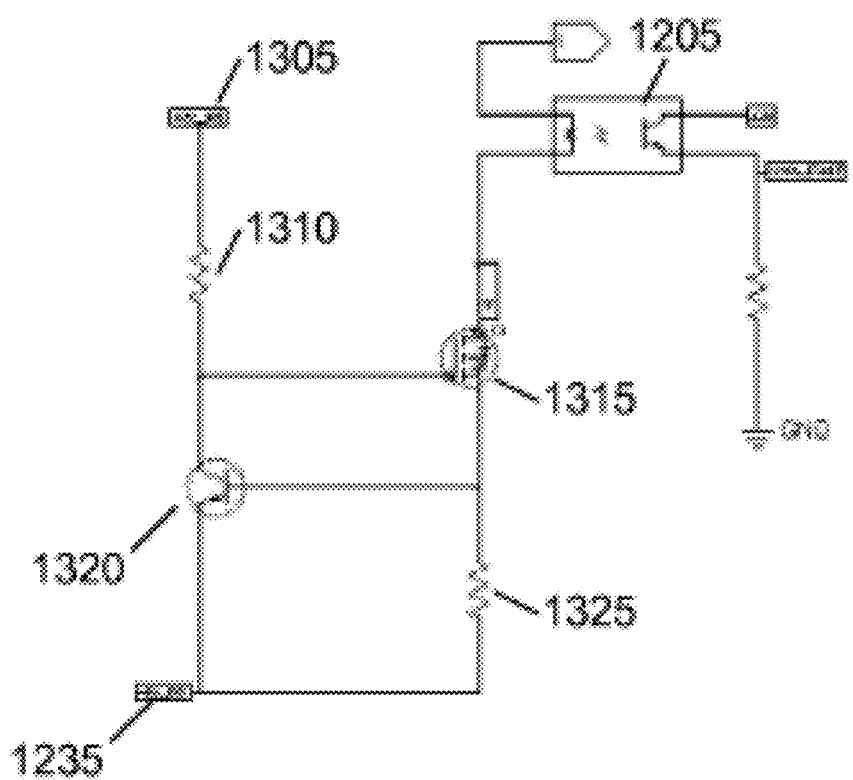

FIG. 18 shows a circuit diagram depicting an exemplary embodiment of the connection fault detection system of the computing device.

Figure 19:
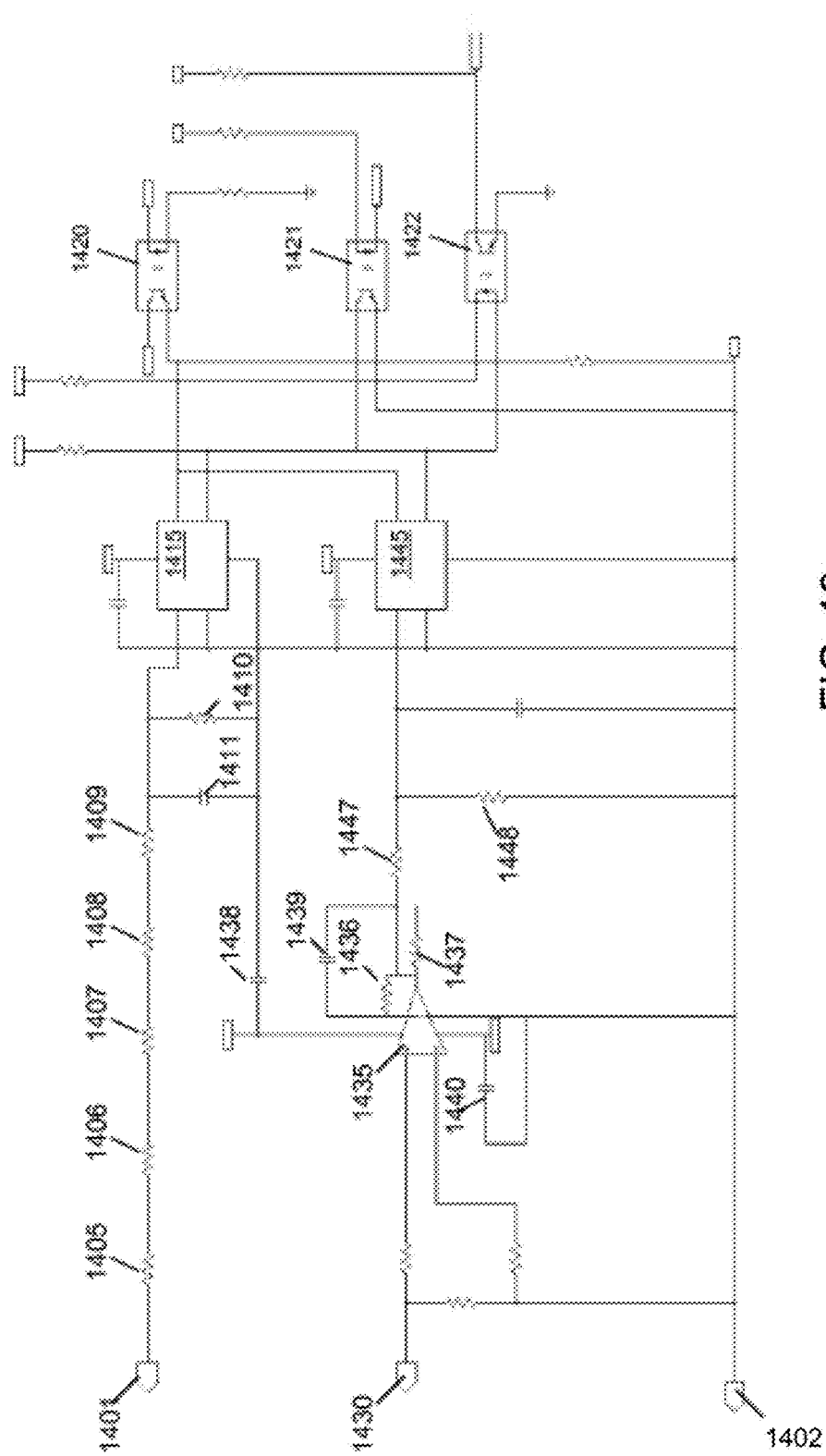

FIG. 19 shows a circuit diagram depicting an exemplary embodiment of the pack voltage and pack current input systems of the computing device.

Figure 20:
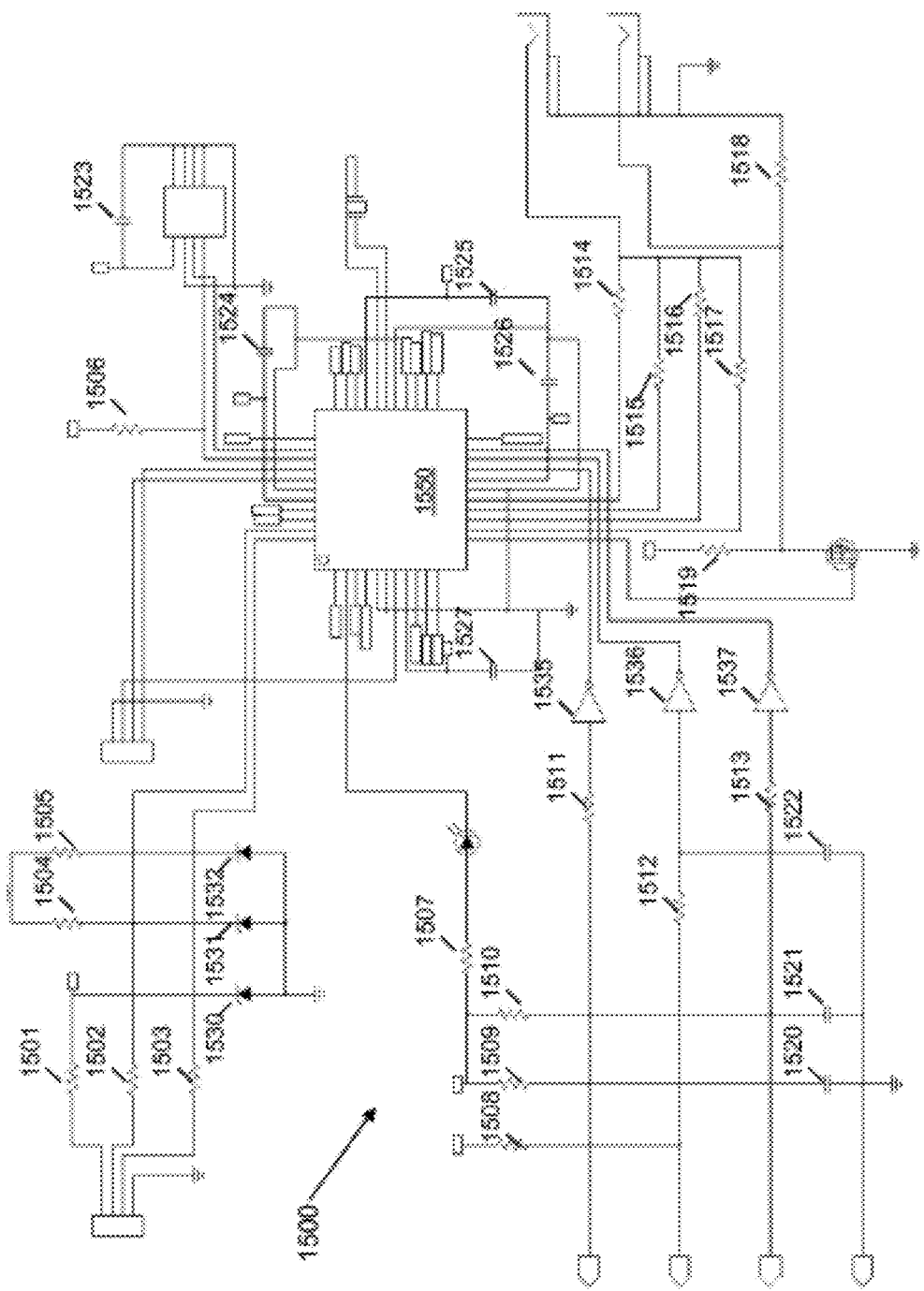

FIG. 20 shows a circuit diagram depicting an exemplary embodiment of the processor of the computing device.

Figure 21:
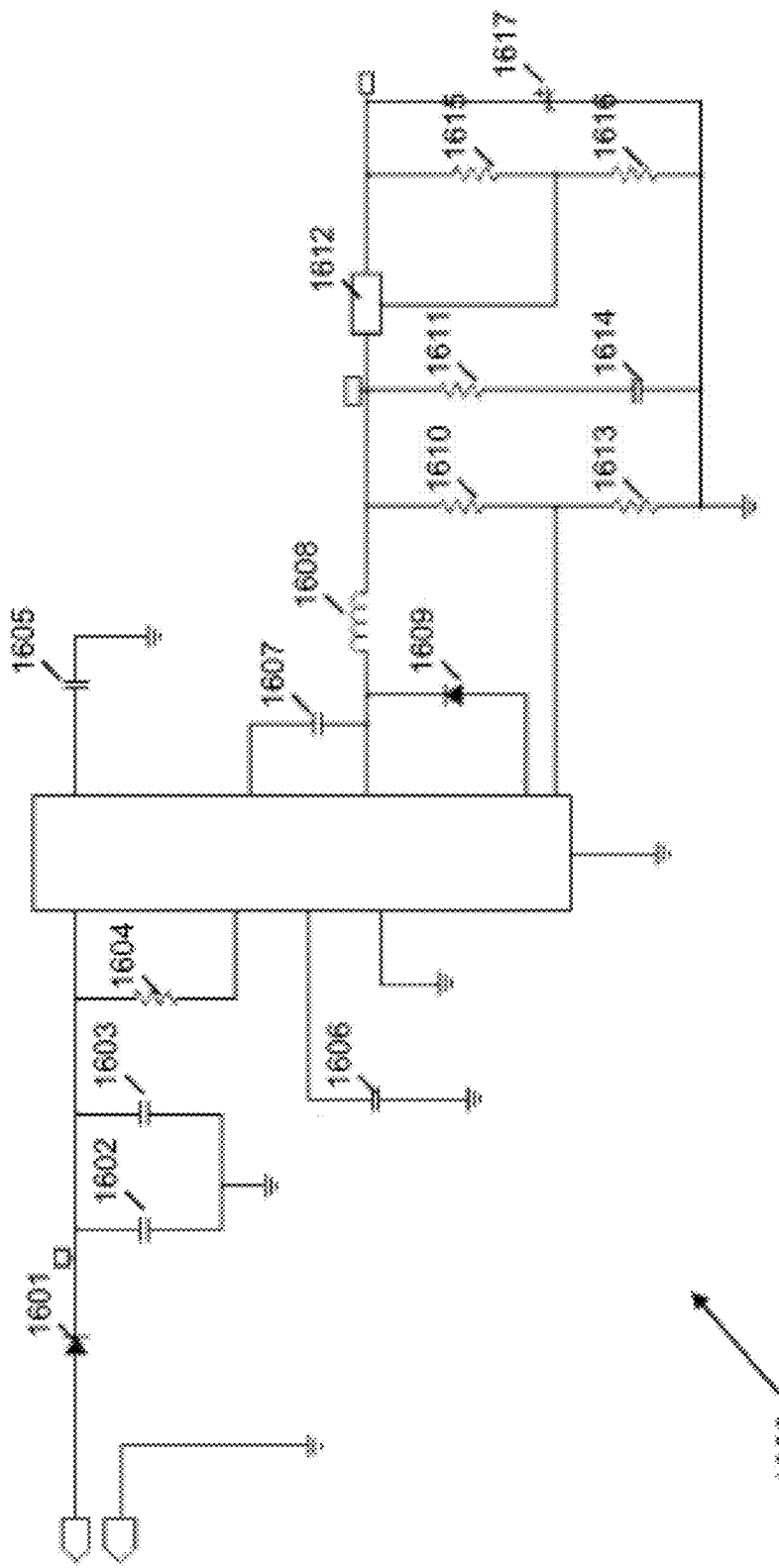

FIG. 21 shows a circuit diagram depicting exemplary embodiments of power supplies used with the battery management system.

Figure 22:
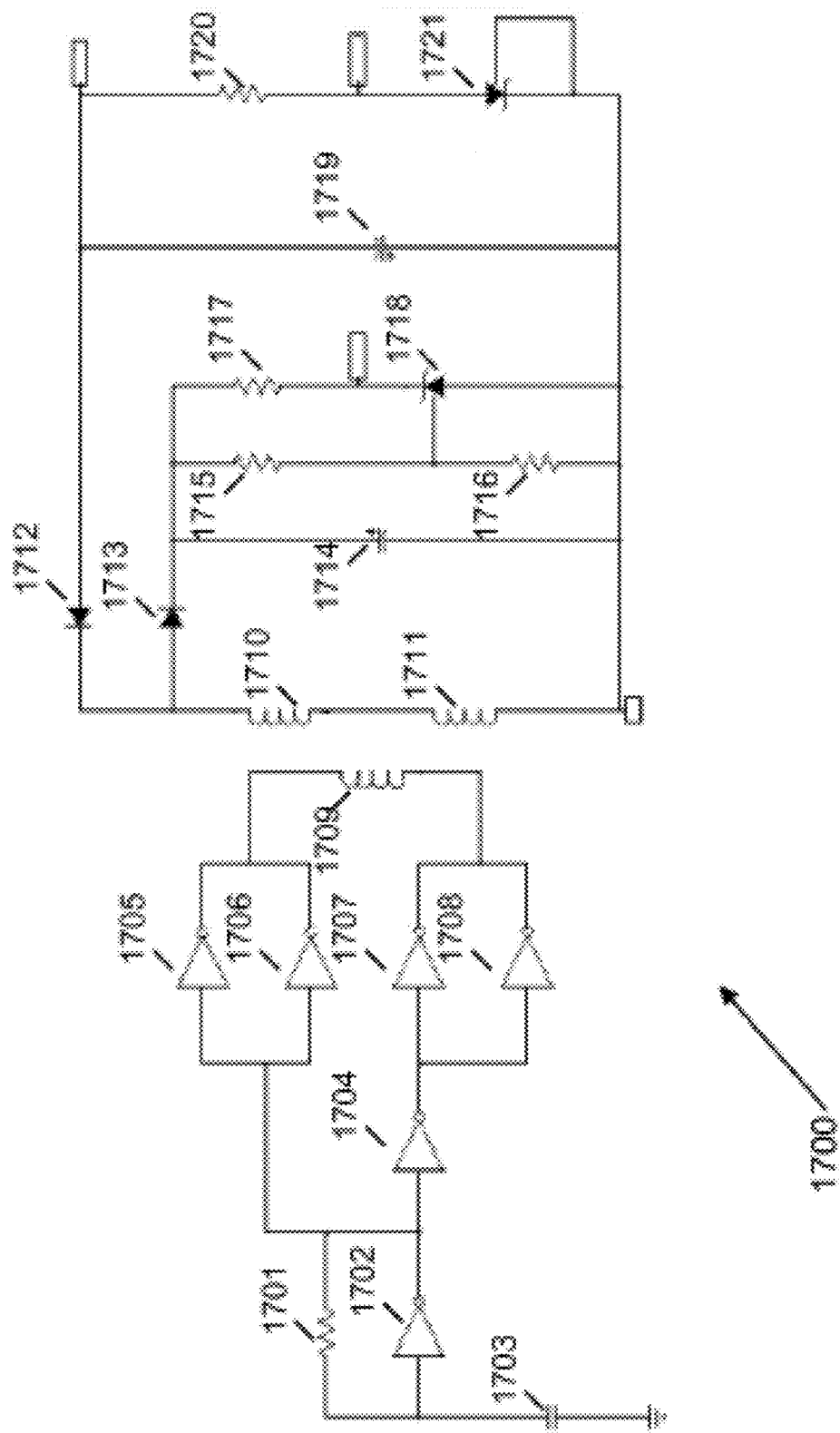

FIG. 22 shows a circuit diagram depicting an isolated power supply to power the circuits of FIG. 19.

Figure 23:
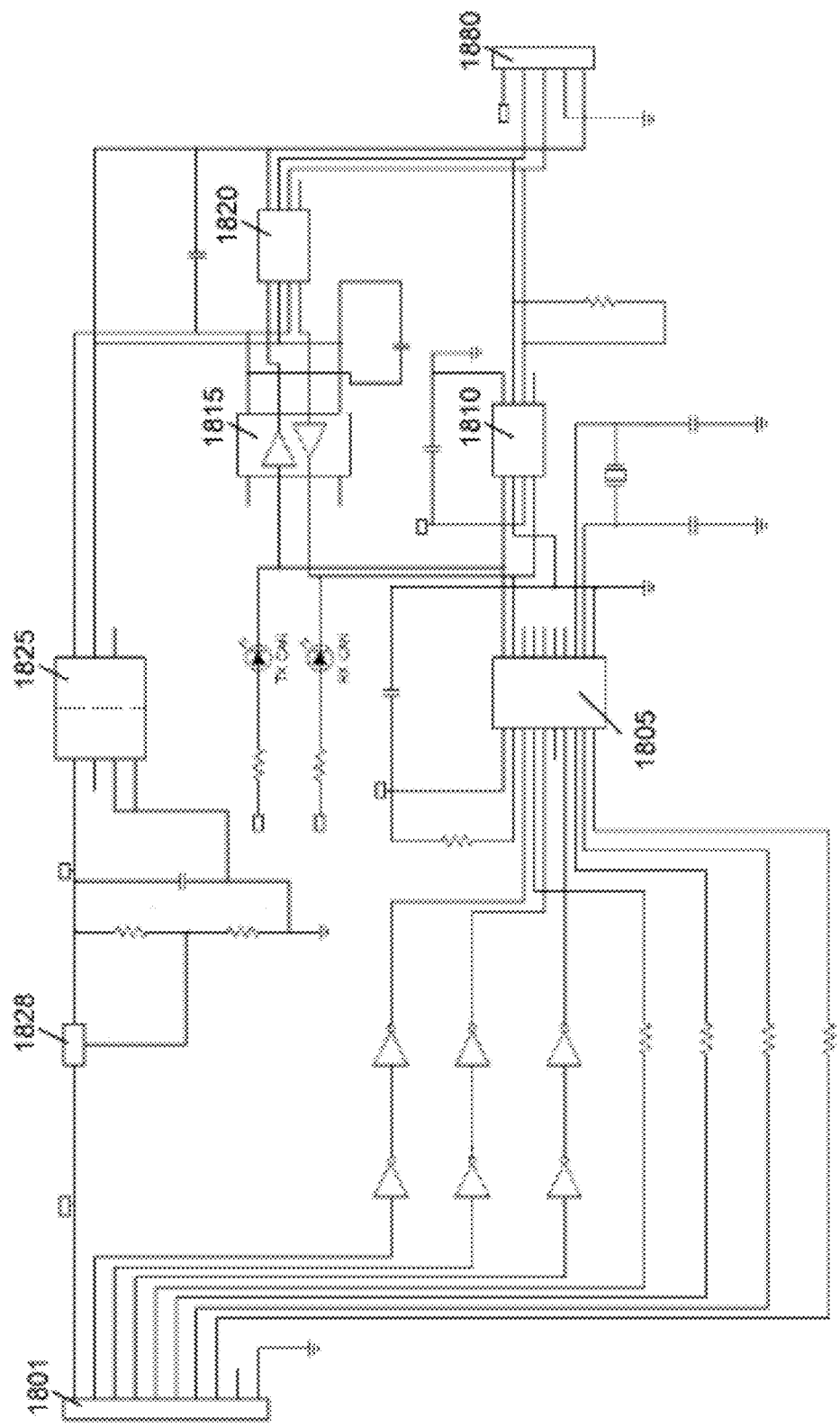

FIG. 23 shows a circuit diagram depicting exemplary embodiments of a controller area network (CAN) interface.

Figure 24:
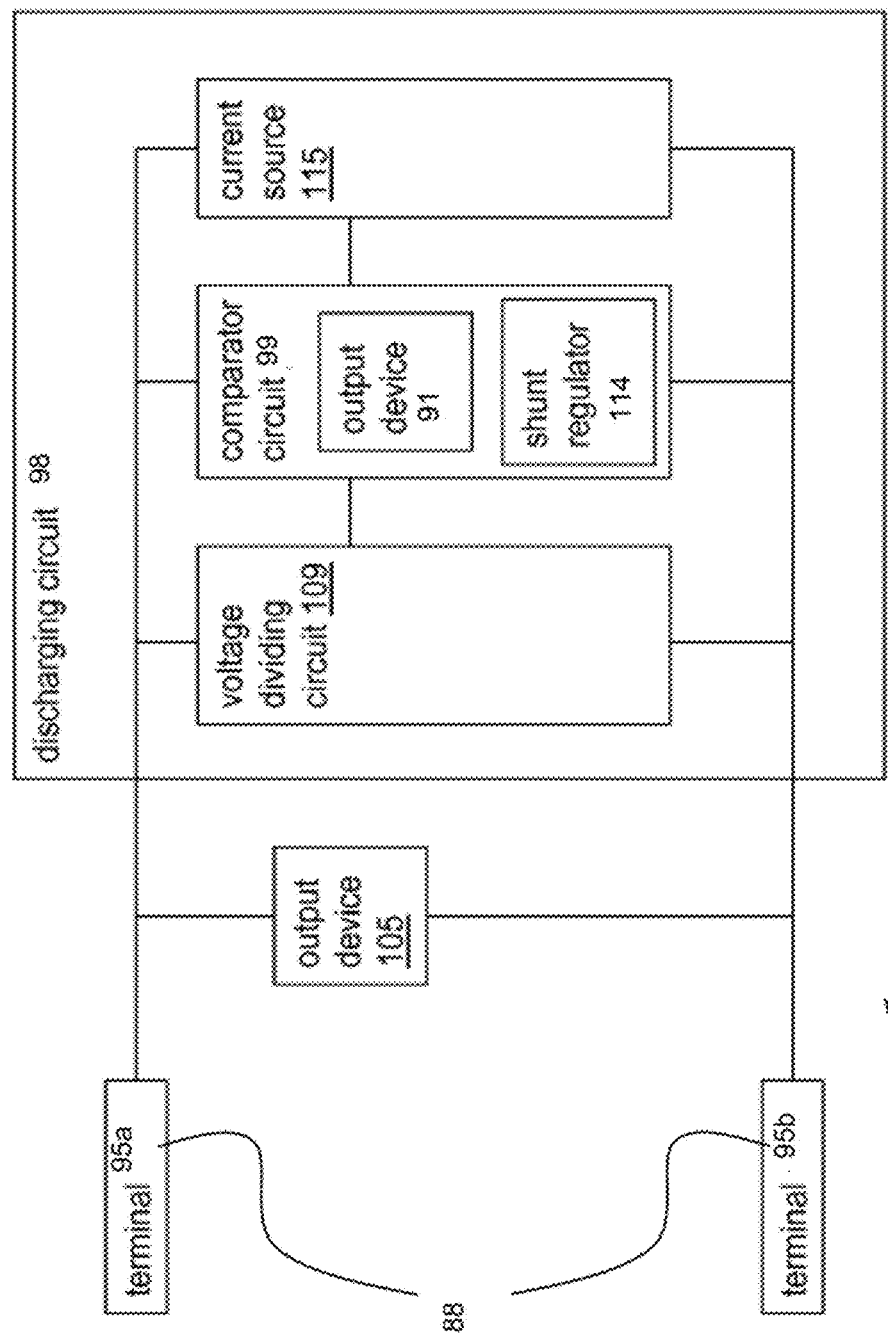

FIG. 24 is a block diagram of an embodiment of a battery unit balancing system.

Figure 25:
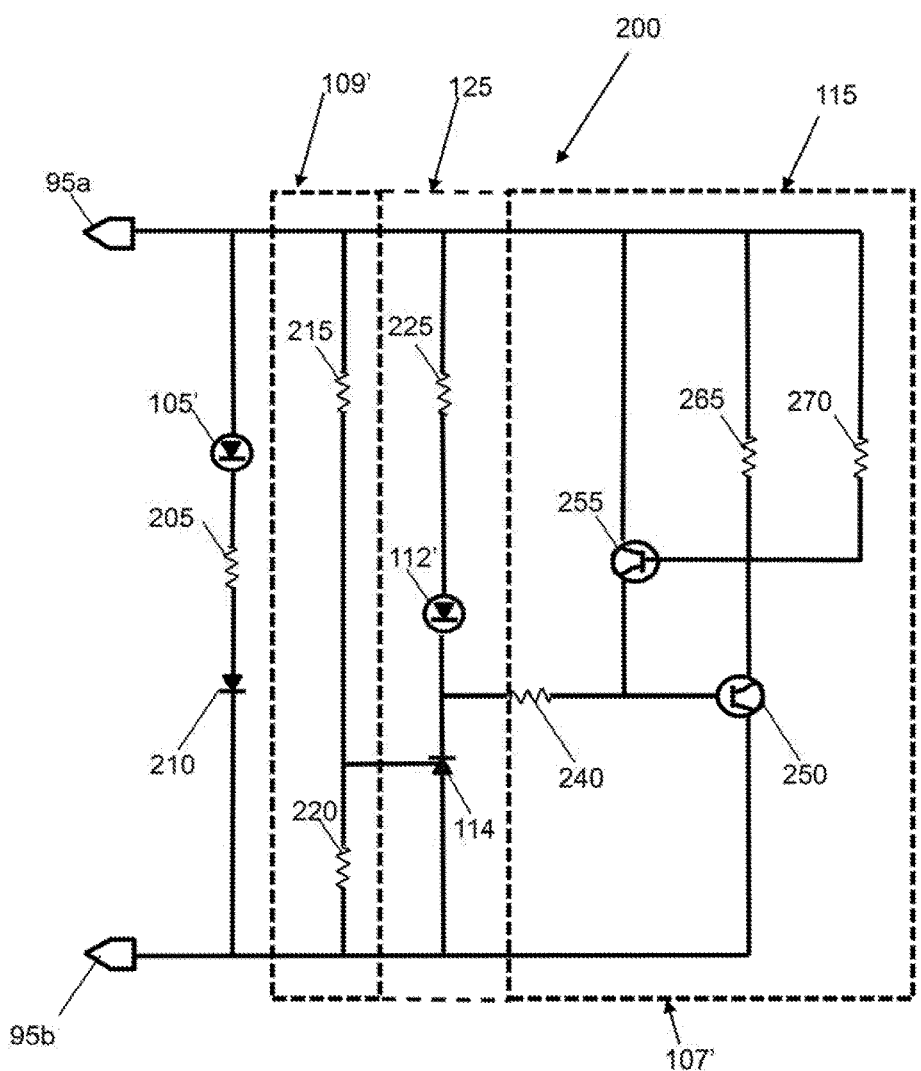
Figure 26:
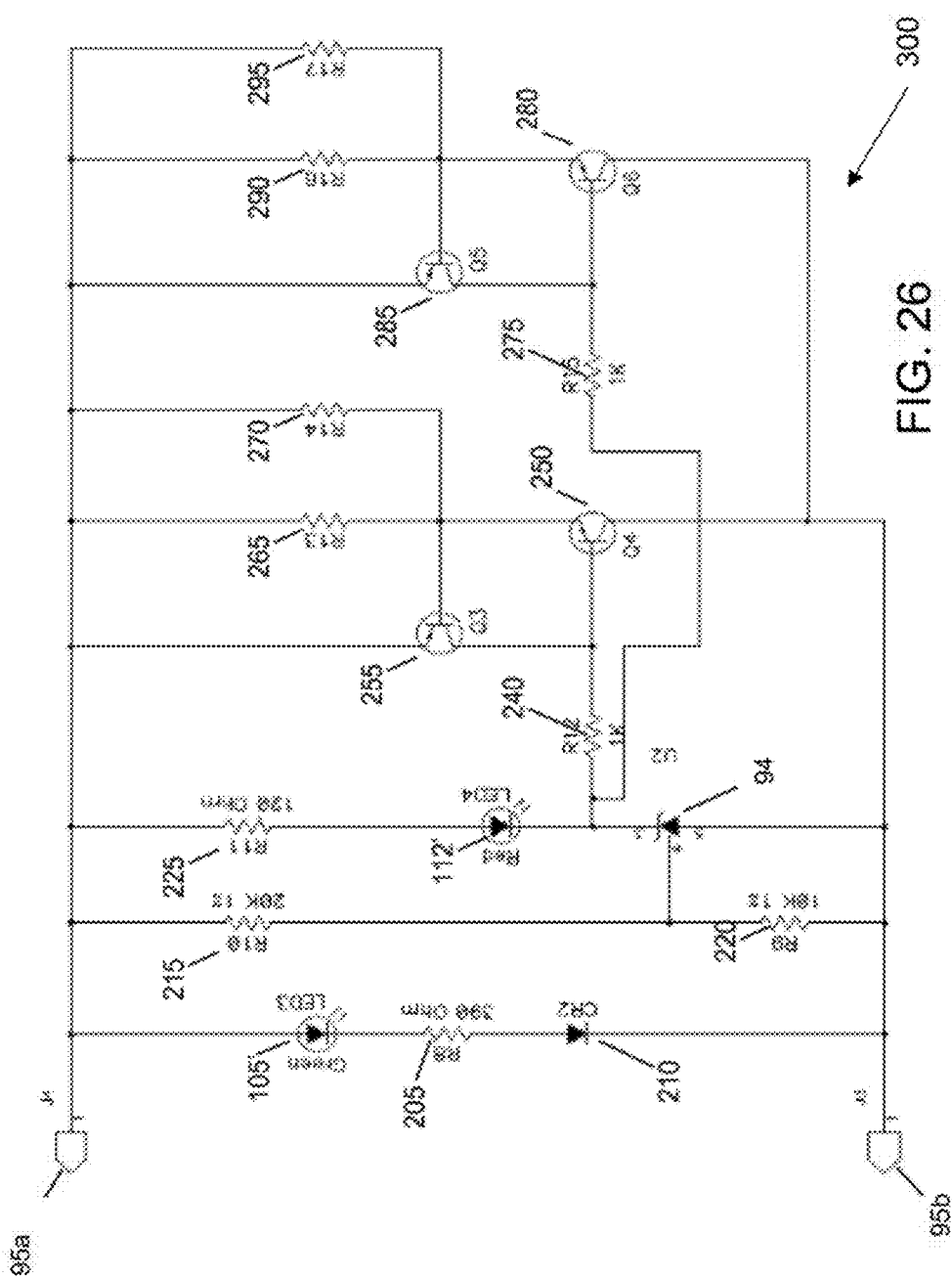

FIGS. 25 and 26 are circuit diagrams of embodiments of battery unit balancing systems.

Figure 27:
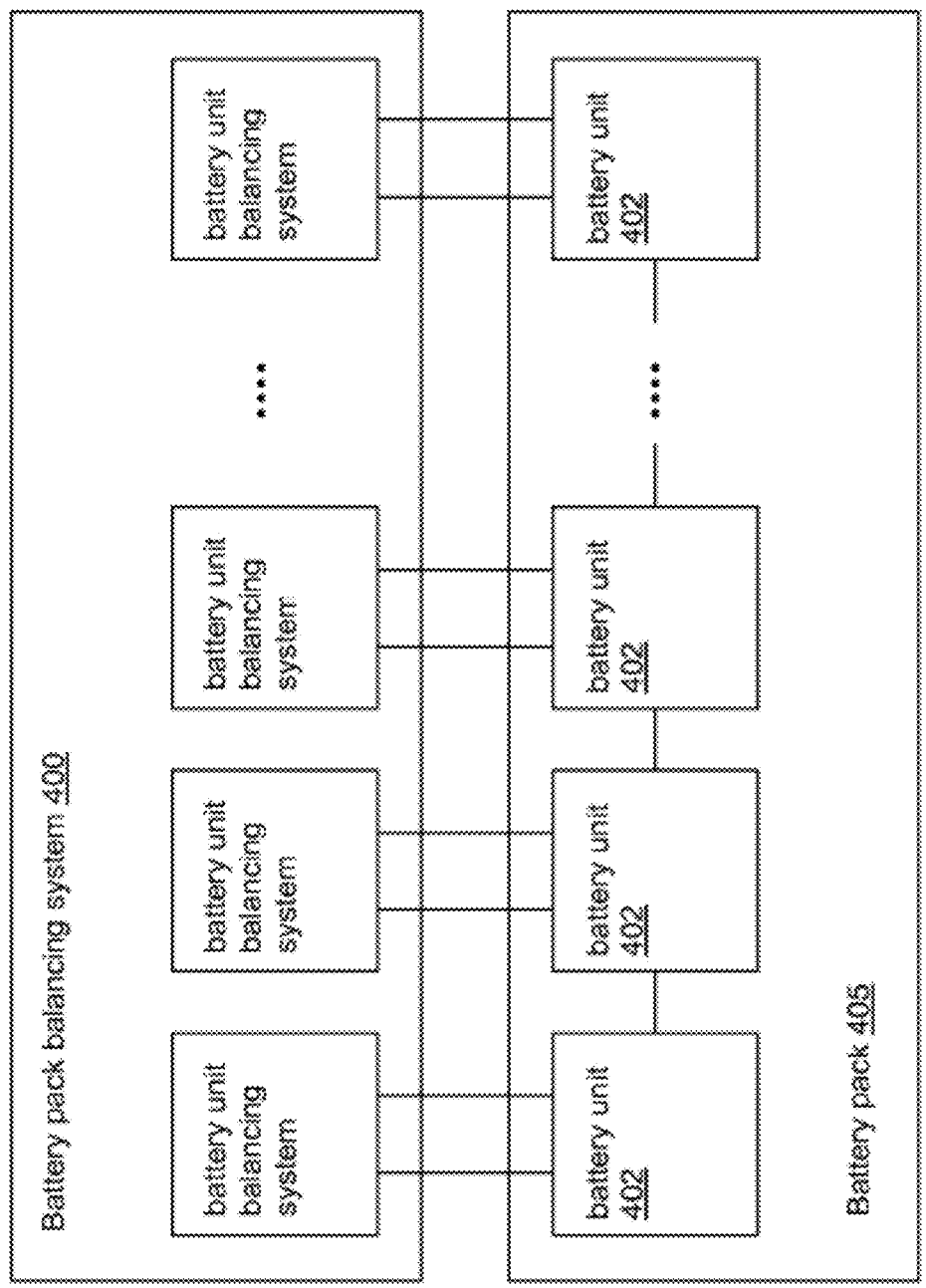

FIG. 27 is a block diagram of an embodiment of a plurality of battery unit balancing systems for balancing a battery pack.

Corresponding reference characters indicate corresponding parts throughout the several views of the figures. The figures represent an illustration of some of the embodiments of the present invention and are not to be construed as limiting the scope of the invention in any manner. Further, the figures are not necessarily to scale, some features may be exaggerated to show details of particular components. Therefore, specific structural and functional details disclosed herein are not to be interpreted as limiting, but merely as a representative basis for teaching one skilled, in the art to variously employ the present invention.

As used herein, the terms "comprises," "comprising," "includes," "including," "has," "having" or any other variation thereof, are intended, to cover a non-exclusive inclusion. For example, a process, method, article, or apparatus that comprises a list of elements is not necessarily limited to only those elements but may include other elements not expressly listed or inherent to such process, method, article, or apparatus. Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

Certain exemplary embodiments of the present invention are described herein and illustrated in the accompanying figures. The embodiments described are only for purposes of illustrating the present invention and should not be interpreted as limiting the scope of the invention. Other embodiments of the invention, and certain modifications, combinations and improvements of the described embodiments, will occur to those skilled in the art and all such alternate embodiments, combinations, modifications, improvements are within the scope of the present invention.

As shown in FIG. 1, a lithium battery has a non-linear discharge profile. The discharge rate from approximately 5% to 80% of full charge is substantially linear but has a very small slope. Therefore, it is difficult to estimate the state of charge of a battery, or battery unit by measuring the voltage. Small variations in voltage may result in erroneous estimates of the state of charge. As described herein, a power control system may calculate the time remaining before a battery pack should be shut down when being used as the output power supply. The power control system and specifically the computing device may initiate battery shut down if a calculated value of 80% discharged or more is reached.

As shown in FIG. 2, an exemplary uninterrupted lithium battery power supply system 10 comprises a battery pack 12, and a power control system 14. The battery pack 12 has a first battery unit 20 and a second battery unit 20'. A battery data input provides data about the status of the battery unit and batteries configured therein to the computing device 52 through the battery data input 62. A computing device may request data from battery monitoring modules (not shown), through the data request output 64. The battery pack is coupled to the power control system 14 by a battery power input 40. An AC power input 42 is connected to an AC power line or cable, in an exemplary embodiment, the power control system utilizes the AC power for output power unless there is an interruption or disturbance in the incoming AC power. A data transmission system 18 is configured to send pertinent data related to the uninterrupted lithium battery power supply system to an external location, such as a monitoring station. A powered device 54 is connected to the power control system at the power output connector 50.

As shown in FIG. 3, an exemplary power control system 14 comprises a plurality of inputs, outputs and indicators. In an exemplary embodiment, a power control system is configured in a single enclosure 15, thereby making installation of the uninterrupted lithium battery power supply system quick and easy. A battery power input 40 is configured to connect to a battery pack to receive power from said battery pack. A battery on/off switch 41 may be used to temporarily disable battery power in the event that the system requires maintenance or repair. A power output connector 50 is configured for providing power to an electronic device and may be any suitable type of plug. An AC power input 42 is configured to couple to an AC power line or cable and may also comprise any suitable type of plug. An AC power switch is configured to enable or disable AC power input. A battery data input 62 is configured to couple to a battery monitoring module to receive data input, regarding the battery pack, unit or individual batteries. As described herein a battery data input may be configured to receive a data transmission cable and in some embodiments comprises a wireless signal receiver. A remote data output connector 80 is configured to couple with a cable or line, such as a phone-line, line, fiber optic line and the like. Again, a remote data output connector may be a wireless signal transmitter that is configured to send data output wirelessly. A umber of indicators, such as lights, are also shown, a computing device indicator 85, a data reception indicator 84, a data transmit indicator 83 and an AC input indicator 82. These indicators may indicate that a particular function is current active.

As shown in FIG. 4, an exemplary battery pack 12 comprises two battery units 20 and 20', each having four individual lithium batteries 21. The batteries are all connected in series by jumpers 27. A jumper 27' connects the first battery unit 20 with the second battery unit 20'. Battery monitoring modules 30 are configured between the positive 28 and negative 29 terminals of the batteries. A battery monitoring module may comprise a voltage sensor 34 and/or a temperature sensor 36. A circuit 87 on a module 30 may be configured to determine the voltage state of a battery. Module connectors 32 connect battery monitoring modules in a daisy-chain configuration. Module connector 32' couples a battery monitoring module from the first battery unit to a battery monitoring module on the second battery unit. A battery power cable 26 is configured to provide power to the power control system. A battery module cable 61 is configured to couple with a battery data input, as shown in FIG. 4.

As shown in FIG. 5, an exemplary uninterrupted lithium battery power supply system 10 comprises a battery pack 12 and a power control system 14. In this exemplary embodiment, only a battery power cable physically couples the battery pack to the power control system. Data from the battery monitoring modules 30 is wirelessly transmitted to the power control system. A wireless transmitter 66 and wireless receiver 68 are coupled on the battery pack 10 and transmit battery status information to the control system. Likewise, the control system comprises a wireless transmitter 66' and wireless receiver 68' for requesting battery status information and receiving battery status information respectively. A powered device 54 is plugged into the power output connector 50.

As shown in FIG. 6, an exemplary uninterrupted lithium battery power supply system 10 comprises a battery pack 12 and a control system 14. The AC power input 42 receives power from an AC power supply. An AC power supply sensor 45 monitors the incoming AC power and may measure the voltage and/or current. In an exemplary embodiment the power output is less than the incoming AC power to ensure a stable and consistent output power level. The AC power supply sensor 45 also communicates AC power input parameters to the computing device, whereby the computing device can make adjustments as necessary to the system based on any AC power input fluctuations. For example, if the AC power input drops below the desired level, the computing device may switch to battery power, or a portion of battery power as a power output source. A battery unit balancing system 19 may comprise a charging circuit 70 that is configured to draw some power from the AC power input to charge the battery pack. The computing device may control the charging and discharging of the battery pack as required. A shunt 94 is configured between the battery pack and the power control system 14 and enables monitoring of the battery pack current. An output regulator 48 is configured to regulate power supply voltage to the output power connector 50. As described herein, the AC power supply and battery pack may be configured to provide a higher voltage than required for the power output the system is designed for, in this way, the power supply to the output regulator may be reduced to ensure a steady and constant power output supply.

Referring now to FIG. 7, a block diagram of an exemplary embodiment of a battery management system 16 connected to a battery pack 12 is shown and described. The battery management system includes battery unit monitoring modules 30 (e.g., sense boards), a computing device 52, and a display 53 (e.g. is monitor such as an LCD monitor or a monitor incorporated into another device, such as a DVD player). The computing device 52 can measure voltage and/or current for the entire battery pack and output the data to the display 53. In various embodiments, the computing device can determine the state of charge of the battery pack 12 by measuring the amount of current that flows in or out of the battery pack. The battery pack can integrate the amount of current to determine the state of charge. In some embodiments, when the battery pack reaches a minimum, predetermined voltage, the computing device can set the pack's state of charge to about 0%. When the battery pack reaches a maximum, predetermined voltage, the computing, device can set the state of charge to about 100%.

In some embodiments, the battery pack 12 may include a plurality of battery units 20 (e.g., battery cells). Each battery unit may include a battery cell or a plurality of battery cells. The battery pack can connect to an external load or powered device 54, such as a motor for an electric vehicle. Each battery unit monitoring modules of the management system can connect to a battery unit. A monitoring module can obtain data, such as voltage and/or temperature, for the battery unit connected to the module. The monitoring modules can transmit the data to the computing device, which can output the data to the display.

In some embodiments, the computing device 52 may be configured to operate with a predetermined, fixed number of battery unit monitoring modules 30. In some embodiments, the computing device may be configured to scan the modules to determine the number of modules present. The computing device can scan the battery unit monitoring modules to determine the number of monitoring modules in the system. For example, in some embodiments, the computing device can output a scan signal to the first monitoring module. In response, the monitoring module can return battery unit voltage and temperature data to the computing device and can output a scan signal to a successive monitoring module. In some embodiments, the monitoring module can also return battery unit voltage and temperature data to the computing device, and can output a scan signal to the next module. Thus, the computing device can count the number of monitoring modules by the number of voltage and temperature data packets received. Further, the computing device can number a monitoring module and/or battery unit based on the module's or unit's position in the order of scan signals received. In some embodiments, a user can configure the computing device to set the number of monitoring modules or to instruct the device to scan the modules and obtain the number of modules itself.

The computing device can detect error conditions for individual battery units and/or the entire battery pack. Exemplary error conditions can include conditions such as high voltage conditions, low voltage conditions, high current conditions, and high temperature condition. Another exemplary error can be a connection fault condition, e.g., a connection between at least one battery unit and a contact point with a zero-voltage reference level, such as a chassis of an electric vehicle.

When an error is detected, the computing device can initiate a measure based on the error condition. For example, if the computing device detects a high voltage condition for the entire battery pack, the computing device can inactivate a device that charges the pack (not shown). In another example, if the computing device detects a first low voltage condition, the computing device 52 can output a low voltage warning to the display. If the battery pack's voltage drops further, triggering a second low voltage condition, the device can inactivate a load connected to the battery pack, such as a motor controller of an electric vehicle.

Referring now to FIG. 8, a block diagram of an exemplary arrangement of battery unit monitoring modules 30 and battery units 20 in a pack 12 is shown and described. In this embodiment, the monitoring modules are connected to the battery units, which are connected in series. Each monitoring module can be connected to a single battery unit. The battery unit can supply the connected monitoring module with power for performing its operations.

FIG. 9 is a block diagram depicting connections within the battery management system 16 between the computing device 52 and the battery unit monitoring modules 30. The computing device includes an output data request part (also referred to herein as an "enable output") and an input data port. Each monitoring module includes an output data port, an input data request port (also referred to herein as an "enable input"), and an output data request port. Each monitoring module's output data port is connected in parallel to the computing device's input data port.

The computing device's output data request port is connected to the first one of the battery unit monitoring module's 30a input data request port. The monitoring module's 30a output data request port is connected to the input data request port of the successive monitoring module 30b. In turn, the monitoring module's 30b output data request is connected to the input data request port of the next monitoring module 30c. The remaining monitoring modules are connected in the same manner. The communications of the computing device 52 and battery unit monitoring modules described herein are transmitted from and received at these ports, as would be understood by one of ordinary skill in the art. Further, in various embodiments, the computing device and monitoring modules include voltage and ground connections such that the computing device can provide power (e.g., 12V) and ground to the monitoring modules.

In operation, to obtain data about the battery units 20, the computing device sends a data request signal (also referred to herein as an "enable signal" or an "enable pulse") to the first battery unit monitoring, module 30a. In response, the monitoring module 30a transmits data about a connected battery unit 20a to the computing device. After the module 30a finishes transmitting data, the module 30a sends a data request signal to the second battery unit monitoring module 30b. In response, the monitoring module 30b transmits data about a connected battery unit 20b to the computing device. After the module 30b finishes transmitting data, the module 30b sends a data request signal to the third battery unit monitoring module 30c, and the process continues for the rest of the monitoring modules.

Using this communication system, the computing device can match data with a battery unit according to the order in which the device receives data. Thus, the first set of data can be matched to the first battery unit 20a, the second set of data to the second unit 20b, and so forth. In this manner, the computing device uses few ports for obtaining data and matching the data to battery rants. In some embodiments, such a battery management system may eliminate the needs for dedicated addressing ports, addressing switches, and/or jumpers.

When the computing device does not receive data from a battery unit 195 for at least a predetermined period of time (e.g. 20 ms, although other times may be used), the computing device can conclude that data collection for the battery unit 20 has been completed. The computing device can obtain another set of data by transmitting another data request to the first battery unit monitoring module 30a, thereby restarting the data collection process. In some embodiments, the computing device can collect data about the battery units as often as needed or programmed, e.g., several times per second.

In some embodiments, the computing device can first compare the number of data received with the number of monitoring modules. If the numbers match, the computing device can determine all the monitoring modules are operational and continue obtaining data about the battery units. If the numbers do not match, the computing device can conclude that at least one monitoring module and/or battery unit is not operational. The computing device can generate and output an error message to the display. Since the modules transmit data to the computing device in sequential order, the computing device can identify the non-operational module or unit according to the number of data received. In this manner, the computing device can inform a user of physical locations of faults in the monitoring modules or battery pack, allowing the user to troubleshoot problems.

Regarding the individual monitoring modules, in some embodiments, a module can measure data for a connected battery unit upon receiving a data request signal. In some embodiments, a module can measure and store data in a buffer. Then, when the module receives the data request signal, the module may access the buffer and may transfer the data stored therein to the computing device.

The monitoring module can transmit the data to the computing device in a human readable form. The monitoring modules can transmit the data via an asynchronous serial protocol, such as protocols used for RS-232 or USB connections. The monitoring modules can transmit the data at any rate and with any number of start and/or stop bits. For example, a module can transmit at 9600 Band with 1 start bit and 1 stop bit.

Referring now to FIG. 10, a diagram depicting connections between battery unit monitoring modules 30 is shown and described, in some embodiments, wiring 400 (e.g., ribbon cable, 4-wire round shape harnesses) can be used to connect the monitoring modules to one another. In some embodiments, for each monitoring module, the output data port can be located in the center of a module's interface. In some embodiments, the input data request port and the output data request port can be symmetrically located on opposite sides of the output data port. By orienting each battery unit monitoring module in an opposite direction from adjacent modules 30, wiring 400 can connect the output data request port of one module to the input data request port of the successive module. Due to the orientation of the ports, the wiring 400 need not be twisted or folded. Further, the wiring 400 can connect all the output data ports to the input data port of the computing device 52. When a monitoring module transmits data for its connected battery unit 20, the data can be sent across each portion of wiring 400 connecting the monitoring modules 30 before the data arrives at the computing device.

FIG. 11 is a hybrid block and circuit diagram depicting an exemplary battery unit monitoring module 30. The monitoring module includes terminals 502 and 503, a microprocessor 505, a reverse connection protection system 510, a battery unit balancing system 515, a voltage regulator 520, resistors 525, 526 for sampling a battery units voltage, and a temperature monitoring device 527 (e.g., a thermistor) for sampling a battery unit's temperature. The monitoring module 30 also includes a receiver 540 for receiving a data request signal from a computing device 110 comprising a microprocessor 505, a driver 541 for transmitting data of the connected battery unit to the computing device 110, and a driver 542 for transmitting a data request signal to another monitoring module.

A battery unit 20 connects to the monitoring module 30 at terminals 502 and 503. Thus, the battery unit applies its voltage to the reverse connection protection system 510. If the voltage is sufficiently high, the protection system 510 conducts and applies the voltage to the voltage regulator 520, resistors 525, 526, temperature monitoring device 527, and balancer 515. If the battery unit is improperly connected to the terminals 502, 503 (e.g., with incorrect polarity), the reverse connection protection system 510 does not conduct, thereby protecting the module from potentially damaging voltages.

When the protection system 510 conducts, the voltage regulator 520 can draw upon the battery units voltage to supply a stable voltage (e.g., 2V) for the monitoring module. In particular, this voltage can power the microprocessor 505. The microprocessor 505 can obtain the battery unit's voltage via resistors 525 and 526 and/or the temperature via temperature monitoring device 527. In some embodiments, the microprocessor 505 can sample the values on the resistors 525, 526 and temperature monitoring device 527 to obtain the voltage and temperature. The microprocessor 505 can store the values in an internal memory.

In some embodiments, when the receiver 540 receives a data request signal, the receiver 540 transmits the signal to the microprocessor 505. In response, the microprocessor 505 obtains the voltage and temperature of the battery unit, either by measuring the values on the resistors 525, 526 and temperature monitoring device 527 or by accessing stored values in an internal memory. The microprocessor 505 transmits the values to the driver 541, which drives the values back to the computing device via, for example, asynchronous serial ASCII communication. At substantially the same time, the microprocessor 505 can generate and output a data request signal to the driver 542. The driver 542 drives the data request signal to the next monitoring module for obtaining data about its connected battery unit.

Referring now to FIG. 12, a circuit diagram of an exemplary embodiment of a battery unit monitoring module is shown and described. In this embodiment, the terminals 602, 603 correspond to the terminals 502, 503 of FIG. 12. The protection system 606 can be a metal-oxide-semiconductor field effect transistor (MOSFET) 605, such as a p-type MOSFET. Terminals of the battery unit can connect to both the source and base of the MOSFET 605. When the battery unit's voltage is sufficiently high, the voltage activates the MOSFET 605. As the MOSFET 605 conducts, the battery unit applies its voltage to the voltage regulator 610. If the battery unit's voltage is insufficiently high, or its polarity is reversed, the MOSFET 605 does not conduct, thereby protecting the module from potentially damaging voltages. In this manner, the MOSFET 605 can operate as a low voltage drop diode 606.

The voltage regulator 610 can be an integrated circuit (e.g., a LP2951) which can use a transistor 611, two operational amplifiers 612, 613, and two resistors 614, 615 to regulate a voltage. Resistors 616, 617 can divide the output of the voltage regulator 610 to, for example, 2V. The divided voltage can be fed back to the error amplifier 612, and the regulator 610 can adjust the output accordingly. In this manner, the voltage regulator 610 can output a substantially constant voltage. The capacitor 618 can filter the divided voltage before supplying the voltage to a microprocessor 620. Further, a power supply can power a clock generator (with capacitors 623, 624, an oscillator 625, resistor 626, and buffers 627, 628) to generate a clock signal. The clock signal can be provided to the microprocessor 620 for its operations.

The battery unit can connect, via the terminals 602, 603, to resistors 629, 630 and a thermistor 631. A node between the resistors 629, 630 and a node adjacent to the thermistor 631 can connect to input ports of the microprocessor 620, which in turn can connect to an internal analog-to-digital converter (also referred to herein as A/D converter). One of the inputs to the internal A/D converter can sample the voltage between the resistors 629, 630 to determine the voltage of the battery unit. Another input to the internal A/D converter can sample the temperature of the battery unit 195, expressed as a voltage, via the thermistor 631. The microprocessor 620 can store the voltage and temperature in an internal memory. In some embodiments, the microprocessor 620 connects to separate A/D converters that sample the voltage and temperature.

The microprocessor 620 can receive a data request signal via the receiver 640 (e.g., an optocoupler). In response, the microprocessor 620 can obtain the voltage and temperature of the battery unit and transmit the values to the driver 641, which drives the values back to the computing device. At substantially the same time, the microprocessor 620 can generate and output a data request signal. The data request signal can connect to the base of a transistor 650. When the signal turns on the transistor, a current flows through the driver 642 to output another data request signal to the next monitoring module.

FIG. 13 is a circuit diagram of an exemplary embodiment awl interface 700 for the computing device. The interface 700 can be used by the computing device for communicating, with to battery unit monitoring modules. The computing device can apply a data request signal to the gate of a transistor 705, such as a metal-oxide-semiconductor field-effect transistor (MOSFET), in response, the transistor 705 conducts and current flows from the voltage source 710 through the resistors 715, 716. The voltage that develops at the node between the resistors 715, 716 activates the transistor 720. As a result, current flows from the voltage source 710 through the transistor 720 and resistor 721 to output a data request signal (e.g., a logic high signal) for the first battery unit monitoring module.

The circuit can receive a data signal (e.g., as 12V signal) through the TX pins on a connector. Resistors 725, 726 can divide the data signal, and the Zener diode 730 can clamp the data signal to a voltage substantially equal to the voltage supplied to the battery unit monitoring modules microprocessor (e.g., 3.3V). An inverter 735, such as a Schmitt Trigger inverter, can eliminate noise and sharpen the rise and fall times of the divided and/or clamped data signal before passing the data signal to the microprocessor of the computing device.

In various embodiments, the interface 700 can be located on the same board as the other components of the computing device. In some embodiments, the communication interface can be isolated from those other components.

FIG. 14 is a block diagram depicting an exemplary embodiment of the computing device of the battery management system. The computing device can include a central processing unit (CPU, e.g. 8-core processor) 905 and a memory 910 (e.g., electrically erasable programmable read-only memory, or EEPROM serial memory) that stores a program with executable instructions. The program can be loaded into the memory 910 from an external device connected via, for example, the bus interface 965 or a USB cable. The CPU 905 can load and execute instructions from the memory 910 to perform its operations. The program may include configuration data, such as the predetermined number of battery unit monitoring modules in the system or the threshold battery unit voltage or temperature that would trigger an error condition. In some embodiments, the program may obtain the configuration data from values input by a user of the system 100.

The computing device can rise an analog-to-digital (A/D) converter 915 to measure the voltage of the battery pack 190. The A/D converter 915 can sample the voltage to obtain a value. The computing device can use an analog-to-digital (A/D) converter 916 to measure the current of the battery pack. In some embodiments, the A/D converter 916 is connected to a shunt, which in turn is connected to a terminal of the battery pack and a terminal of the external load 198. The shunt can be a resistor that develops a voltage drop proportional to the battery pack's current (e.g., 0.0001 Ohms developing a voltage drop of (0.1 mV/A). An amplifier 917 can amplify the value of the current before the A/D converter 916 samples the current. The A/D converters 915, 916 can direct the battery pack voltage and current to an isolation barrier 920 controlled by a signal from a connection fault detector 925. In some embodiments, the A/D converters 915, 916 are on the same board as the CPU 905, isolated, and/or both.

The connection fault detector 925 can signal the presence of a connection between a battery unit 195 and a zero-voltage reference level. For example, the zero-voltage reference level can be the battery pack's 190 enclosure or chassis, and the connection between a battery unit 195 and the chassis would represent a hazard to service personnel. When one or more battery units 195 within the battery pack 190 contacts a point at the zero-voltage reference level, the contact can cause current to flow from the battery unit 195. The connection fault detector 925 detects the connection and outputs a signal to the CPU 905 which will display a warning indicating this connection on the display device 115.

The CPU 905 can connect to the battery unit monitoring modules to obtain data about the individual battery units 195, as described in reference to FIGS. 10-12. The CPU 905 can process data about the individual battery units 195 and/or battery pack 190 to create a composite video signal. A digital-to-analog (D/A) converter 930 (e.g., a 3-bit converter) can produce the composite video signal from digital to analog format so the signal can be displayed on a display 115.

If the CPU 905 detects an error condition, the CPU 905 can transmit an error signal to an alarm output system 940. The system 940 can be used to control a component and/or device that responds to the error signal (e.g., a charger that stops charging the battery pack 190, or a motor controller of an electric vehicle that stops discharging the battery).

The computing device can include power supplies 960 (not shown on FIG. 14). The power supplies 960 supply voltages to components of the battery management system 100. In some embodiments, a power supply 960 can include an internal voltage regulator to provide a constant voltage. The power supplies 960 can be isolated from the other components of the computing device to prevent damage to the device.

The computing device can include an interface 965, such as a controller area network (CAN) interface. The interface can include ports, such as parallel port pins. The computing device can connect to external devices via an interface (not shown). For example, the device can connect to another computing device to receive a program to be stored in the memory 910.

The computing device can include a port 970 for receiving a page select signal. A page can correspond to a format for displaying data about a battery unit 195 within the battery pack 190. For example, one page can display the data for the entire pack 190. Another page can display the voltages and temperatures of eight, twenty, or any other number of battery units 195. Successive pages can display the same information for adjacent sets of battery units 195. The computing device can receive the page select signal from a switch mounted in a dashboard in an electric vehicle, for example (not shown). In response, the computing device can output the selected page containing battery pack data to a display 115.

FIG. 15 is a block diagram depicting an exemplary embodiment of the alarm output system 940 of the computing device. The alarm output system 940 receives an error signal from the computing device. The alarm output system 940 outputs a binary signal according to the error signal. If the error signal corresponds to an off signal, the system 940 allows current to flow to a ground reference, thereby outputting a logic low signal (e.g., 0V). If the error signal corresponds to an on signal, the system 940 allows current to flow from a voltage source, such as 12V. In some embodiments, the system 940 does not allow current to flow until the error signal lasts at least 30 seconds. In this manner, the system 940 turns on or off external devices according to the persistent presence of an error.

FIG. 16 is a circuit diagram depicting an exemplary embodiment of the alarm output system 940 of the computing device. The alarm output system 940 includes a voltage source 1101, two resistors 1103, 1104, four transistors (e.g. metal-oxide-semiconductor field-effect transistors or MOSFETs) 1105, 1106, 1107, 1108 configured to form an H bridge, and two transistors 1120, 1121 that operate the alarm output system 940. Transistors 1105, 1108 can be of opposite polarity from transistors 1106, 1107. The alarm output system 940 can apply one or more received error signals to the transistors 1120, 1121 and output one or more command signals corresponding to the error signals at terminals 1130, 1131.

In operation, an error signal can be applied to transistor 1120 and/or transistor 1121. If the computing device detects a low voltage condition, the device 110 can apply an error signal to transistor 1120. As transistor 1120 conducts, the voltage applied to the gates of transistors 1107, 1108 by the voltage source 1101 drops. The voltage differential between the source and gate of transistor 1107 decreases to turn the transistor 1107 off. The voltage differential between the source and gate of transistor 1108 increases to turn the transistor 1108 on. As transistor 1108 conducts, current flows from the voltage source 1101 through the transistor 1108 to the output terminal 1130. The voltage that develops on the output terminal 1130 can be used to shut off a motor controller, by way of example.

If the computing device detects a high voltage condition, a high current condition, or a high temperature condition, the device can apply an error signal to transistor 1121. As transistor 1121 conducts, the voltage applied to the gates of transistors 1105, 1106 by the voltage source 1101 drops. The voltage differential between the source and gate of transistor 1106 decreases to turn the transistor 1107 off. The voltage differential between the source and gate of transistor 1108 increases to turn the transistor 1105 on. As transistor 1105 conducts, current flows from the voltage source 1101 through the transistor 1105 to the output terminal 1131. The voltage that develops on the output terminal 1130 can be used to shut off a battery charger or turn on a fan, by way of example.

FIG. 17 is a circuit diagram depicting an exemplary embodiment of the connection fault detection system of the computing device. The connection fault detection system includes an optocoupler 1205 with a light emitting diode 1210 and a transistor 1215, such as a phototransistor. One terminal of the light emitting diode 1210 connects to ground (also referred to herein as "a node at a ground zero reference level"), such as a chassis of an electric, vehicle. The other terminal of the light emitting diode 1210 connects to a current sink 1220. One terminal of the transistor 1215 connects to a voltage source 1225. The other terminal connects to a node corresponding, to the output 1228 of the optocoupler 1205 (also referred to herein as the "output node"). This node connects to a resistor 1230 that also connects to a ground zero reference level, which can be electrically isolated from the battery pack 190. The current sink 1220 connects to the negative terminal of a voltage source 1235. The positive terminal of the voltage source 1235 connects to the negative terminal of at least one battery unit 195 of the battery pack 190.

In operation, when none of the terminals of the battery units 195 connect to ground, current does not flow through the light emitting diode 1210 of the optocoupler 1205. The light emitting diode 1210 does not activate the transistor 1215, and the transistor 1215 does not conduct. Because the node 1228 corresponding to the optocoupler's 1205 output is disconnected from the voltage source 1225, any charge at the node drains through the resistor 1230 to ground. In this manner, the optocoupler 1205 outputs a logic low signal, such as 0V, indicating that a connection fault has not been detected.

When a positive terminal of a battery unit 195 does connect to a zero-voltage reference level, current flows through the light emitting diode 1210 to the current sink 1220. The current activates the transistor 1215 so the transistor 1215 conducts. Current flows from the voltage source 1225, building charge at the output node 1228. Thus, the optocoupler 1205 outputs a logic high signal indicating that a connection fault has been detected. The logic high signal can be applied to CPU 905, which can output a message to the display device warning an operator of the battery unit management system of a potentially hazardous connection fault.

The voltage sources 1225, 1235 can have any voltage. For example, voltage source 1225 can provide 3.3V. Voltage source 1235 can provide 5.0V. The current sink 1220 can limit the current flowing through itself and the light emitting diode 1210 to any current, such as a minimum safe level of current. For example, the current sink 1220 can limit the current to 2 mA. The current sink 1220 can operate over a range of voltages of the battery pack 190, such as the voltages between the battery pack's 190 positive and negative terminals. In some embodiments, this range can be from about 5V to about 500V. In some embodiments, the current sink 1220 can operate at voltages that exceed the voltage at the positive terminal of the battery pack 190.

FIG. 18 is another circuit diagram depicting an exemplary embodiment of the connection limit detection system of the computing device. This embodiment includes all the components described in reference to FIG. 17. In addition, in this embodiment, the current sink 1220 includes a voltage source 1305, a first resistor 1310, a first transistor 1315, a second transistor 1320, and a second resistor 1325. The voltage source 1305 connects to one terminal of the first resistor 1310. The other terminal of the first resistor 1310 connects to the gate of the first transistor 1315 and the emitter of the second transistor 1320. The source of the first transistor 1315 connects to the optocoupler 1205. The drain of the first transistor 1315 connects to the base of the second transistor 1320 and one terminal of the second resistor 1325. The other terminal of the second resistor 1325 connects to the collector of the second transistor 1315 and the negative terminal of the voltage source 1235.

In operation, current flows from the voltage source 1305 through the first resistor 1310 to activate the first transistor 1315 such that the first transistor 1315 conducts. When a terminal of a battery unit 195 connects to ground, current flows through the optocoupler 1205, the first transistor 1315, and the second resistor 1325. The voltage that develops across the second resistor 1325 activates the second transistor 1320. As the second transistor conducts 1320, current is diverted from the gate of the first transistor 1315. The transistors 1315, 1320 and resistors 1310, 1325 reach equilibrium such that a constant current flows through the first transistor 1315.

The transistor 1315 can be any type of transistor, such as a metal-oxide-semiconductor field-effect transistor (MOSFET), an insulated gate bipolar transistor (IGBT), or a NPN transistor. In some embodiments, a 2N3904-type transistor is used for the second transistor 1320.

FIG. 19 is a circuit diagram depicting an exemplary embodiment of the pack voltage and pack current input systems of the computing device. The battery pack 190 can connect to the systems at terminals 1401, 1402. Resistors 1405, 1406, 1407, 1401, 1409, 1410 can divide the battery pack 190 voltage from 500V to 2V, by way of example. A capacitor 1411 can filter the divided voltage, and an A/D converter 1415 can sample the voltage. The A/D converter 1415 can transmit the voltage to a processor of the computing device 110, such as CPU 905. Optocouplers 1420, 1421, 1422 can create an isolated communication interface between the A/D converter 1415 and the processor.

The voltage drop across a shunt can be input at terminal 1430. The operational amplifier 1435, resistors 1436, 1437, and capacitors 1438, 1439, 1440 can form an amplifier to amplify the voltage drop. Because the amplifier has a fixed gain, such as 80, the amplified voltage may exceed the capacity of the A/D converter 1445 that samples the voltage. Thus, resistors 1447, 1448 can form a voltage divider that divides the amplified voltage to a level the A/D converter 1445 can process. The A/D converter 1445 can sample the voltage and transmit the voltage to the processor, which can calculate the battery pack 190 current based on the value of the shunt. The A/D converter 1445 can use the same communication interface as the A/D converter 1415 to transmit its sampled voltage.

FIG. 20 is a circuit diagram depicting an exemplary embodiment 1500 of the central processing unit 905 of the computing device 110. Resistors 1501-1519, capacitors 1520-1527, Zener diodes 1530-1532, and inverters 1535-1537 condition the inputs and outputs for the central processing unit 1550.

FIG. 21 is a circuit diagram 1600 depicting an exemplary embodiment of a power supply that can be used with the battery management system 100. The power supply 1600 can be a step down switching voltage regulator. The components 1601-1616 can operate to produce a voltage, such as 5V or 12V. In particular, component 1612 can be a linear voltage regulator that accepts a voltage produced by the other components of the system and outputs a substantially constant 3.3V.

FIG. 22 is a circuit diagram 1700 depicting an exemplary embodiment of another power supply that can be used with the battery management system 100. The power supply 1700 can be an isolated power supply. Components 1701-1708 can operate as an oscillator that produces 40 KHz. The transformer with windings 1709-1711 can transfer energy produced by the oscillator to components 1712-1721, which can operate as positive and negative half-wave rectifiers and a shunt regulator. The rectifiers and shunt regulator can operate to produce a substantially constant output voltage.

FIG. 23 is a circuit diagram depicting an exemplary embodiment of a controller area network (CAN) interface used with the battery management system 100. The interface can be used to connect as CPU 905 of a computing device with an external device via a CAN bus. A connector 1801 can attach to a component of the computing device 110, such as the CPU board. The other connector 1880 can attach to a CAN bus that connects to an external device. The computing device and external device can communicate over the interface using a standard bus protocol such as a serial peripheral interface (SPI) protocol. In some embodiments, the devices can use handshaking signals, such as receiver buffer full and interrupt.

The interface chip 1805 can operate in a non-isolated mode or an isolated mode. In the non-isolated mode, the interface chip 1805 communicates with the bus buffer 1810 with data received, for example, from an external CAN-enabled device, in some embodiments, the bus buffer 1810 can receive data from the bus ports 1880. The interface chip 1805 can send a transmit signal to the buffer 1810 so the buffer 1810 outputs its data to the bus ports 1880. The interface chip 1805 can send a receive signal so the buffer 1810 outputs its data obtained from the bus ports to the interface chip 1805.

In the isolated mode, an isolator 1815 isolates the interface chip's 1805 transmit and receive signals from a buffer 1820. The isolator 1815 can be a magnetic isolator. An isolated power supply 1825 can use a voltage from a voltage regulator 1828 to provide power for the isolator 1815 and buffer 1820. In some embodiments, the voltage regulator 1828 receives a 12V signal and outputs a 5V signal.

The present disclosure is directed to a battery unit balancing system. The balancing unit balancing system connects to a battery unit after the unit has been charged and discharges the unit to a desired, programmable voltage. The balancer can be permanently connected. The battery unit can be a standalone unit, such as a single batter cell, or include one or more battery cells. Battery units can be grouped to form battery packs, such as battery packs for electric vehicles, and battery unit balancing systems can be connected to the battery units to balance each of the units. In any of these embodiments, the battery units can be lithium ion cells.

Referring now to FIG. 24, a block diagram of an embodiment of a battery unit balancing system 19 is shown and described. The battery unit balancing system 19 can include a pair of terminals 95a and 95b (collectively 88). The battery unit balancing system 19 can include an output device 105 and a discharging circuit 98. The discharging circuit can include a voltage dividing circuit 109, a comparator circuit 99 with its own output device 91 and shunt regulator 114 (e.g., a programmable Zener diode, a TLV431 manufactured by Texas Instruments, Inc. of Dallas, Tex.), and a current source 115 each connected in parallel to the terminals. The voltage dividing circuit 109 can connect to the current source 115 via the comparator circuit 99.

In operation, the terminals 88 of the battery unit balancing system 19 can be connected to a battery unit. When the battery unit is connected to the terminals with the incorrect polarity, no current flows. When the battery unit is connected correctly, current flows from one terminal 95a to the other 95b through the output device 105, powering the output device (e.g., a light emitting diode or LED) to emit light. In this manner, the output device can indicate to a user of the battery unit balancing system that the batter), unit has been correctly connected to the system and the system is receiving power.

The voltage dividing circuit 109 can generate a partial voltage based on the voltage of the battery unit and provide the partial voltage to the comparator circuit 99. When the voltage of the battery unit exceeds a predetermined threshold, the comparator circuit can be automatically activated to conduct current from the battery unit. The current can power the output device 91 of the comparator circuit to emit light. Thus the output device can indicate that the discharging circuit 98 has been activated.

Further, from the current, the comparator circuit 99 can generate a programmable voltage that activates the current source circuit 115. The current source can draw a constant discharging current from the battery unit. As the current source draws current, the voltage of the battery unit falls. When the voltage falls below the predetermined threshold, the comparator circuit 99 deactivates and the current source ceases to draw current from the battery unit, leaving the battery unit with the desired voltage.

Referring now to FIG. 25, a circuit diagram of an embodiment of a battery unit balancing system 200 is shown and described. The battery unit balancing system includes a pair of terminals 95a and 95b (collectively, 95) that can connect to a battery unit. The system includes an output device 105' (in this embodiment, a green LED) connected in series with a resistor 205 and another diode 210. When the voltage of the battery unit exceeds the on-voltages of the LED 105 and the diode 210, the LED and diode 210 conduct. Current flows through the LED, and the LED emits light to indicate to a user that the battery unit has been connected correctly to the system 200.

The voltage dividing circuit 109' generates a predetermined voltage at the node (also referred to herein as the "node voltage") between the first resistor 215 and the second resistor 220 to activate the shunt regulator 114 and consequently, the current source 115. The resistances of the first resistor 215 and the second resistor 220 determine the value of the node voltage according to the following equation:

$$V \text{ node} = V \text{ battery unit} * R2/(R1+R2)$$

The resistors 215 and 220 can be variable resistors with adjustable resistances. The resistors can be programmed to generate any voltage from the voltage of the battery unit. In some embodiments, the resistors 215 and 220 can have fixed resistances. In this embodiment, the first resistor 215 has a resistance of 20,000 Ohms and the second resistor 220 has a resistance of 10,000 Ohms. Thus, the node voltage is ⅓ the voltage of the battery unit connected to the terminals 102.

When the voltage of the battery unit is below a predetermined threshold (e.g., about 3.7 V), the voltage dividing circuit 109' generates a node voltage below the on-voltage (e.g., about 1.2 V) of the shunt regulator 114. Under these circumstances, the shunt regulator 114 does not conduct. However, when the voltage of the battery unit equals or exceeds the predetermined threshold, the node voltage applied, to the shunt regulator 114 activates the shunt regulator 114. Upon activation, current flows from the battery unit through the third resistor 225, the red LED 112', and the shunt regulator 114. The current powers the red LED 112', which emits light and indicates to a user that the discharge circuit 107' has been activated, the entire outer perimeter of the dashed boxes.

Further, current flowing through the comparator circuit (e.g., from the base of the first transistor 250 through the fourth, current limiting resistor 240) can activate the current source 115. The current can flow through the fourth resistor 240 (e.g., out of the base of the first transistor 250), to form a voltage on the base of the first transistor 250, thereby beginning to turn on the first transistor 250 Once the first transistor 250 conducts, current can flow from the first terminal 95a of the battery unit through the fifth resistor 265, the sixth resistor 270, and the first transistor 250 to the second terminal 95b of the battery unit.

As current flows through the fifth 265 and sixth resistors 270 (e.g., out of the base of the second transistor 255), a voltage can form on the base of the second transistor 255. The voltage on the second transistor 255 rises, and the second transistor 255 begins to turn on. When the second transistor 255 conducts, the second transistor 255 draws current from the base of the first transistor 250 and starves the base for current, in this manner, the first transistor 250 and the second transistor 255 interact to form an equilibrium so that a substantially stable current flows from one terminal 95a to the other 95b through the fifth 265 and sixth resistors 270, thereby dissipating power. The current can continue to flow independent of the voltage of the battery unit. In some embodiments, the discharging current is about 0.5% of the ampere-hour rate of the battery unit. In many embodiments, the discharging current is selected from 0.22 A, 0.33 A, 0.5 A, 0.89 A or 1.11 A.

As the current source 115 draws current from the battery unit, the voltage of the battery unit falls. The node voltage of the voltage dividing circuit 109' falls in tandem. When the node voltage falls below the predetermined threshold of the shunt regulator 1114, the shunt regulator ceases to conduct. Current stops flowing through the red LED 96 and the red LED turns off, thereby indicating to the user that the discharging circuit 107' is no longer activated. Consequently, current stops flowing to the base of the first transistor 250. In turn, the first transistor 250 stops conducting and thus shuts off the current source 115. In this manner, the discharging circuit 98 automatically deactivates once the battery unit reaches the predetermined threshold voltage.

Referring now to FIG. 26, a circuit diagram of another embodiment of a battery unit balancing system 300 is shown and described. The battery unit balancing system 300 duplicates the terminals 95a and 95b, output device, voltage dividing circuit, the comparator circuit, and current source of the battery unit balancing system 200 of FIG. 25. In addition, the battery unit balancing system 300 includes a second current source. The second current source duplicates the components of the first current source and operates according to the same principles. Since each current source draws the same amount of current, adding current sources to the discharging circuit creates a balancing system 300 that drains the battery unit at a faster rate. In this manner, the battery unit balancing system 300 can balance a battery unit is a shorter amount of time. Although the system 300 includes two current sources, additional current sources can be added as desired by one of ordinary skill in the art.

Referring now to FIG. 27, a block diagram of an embodiment of a plurality of battery unit balancing systems for balancing a battery pack is shown and described. A battery pack balancing, system 400 includes a plurality of battery unit balancing systems, each system being autonomous from one another. Each battery unit balancing system can connect to a battery unit 402 in a battery pack 405. Each balancing system can balance its corresponding battery unit 402 according to the steps described in reference to FIGS. 24-26. The balancing systems can balance the battery units 402 to a substantially same level. Thus, the battery pack balancing system 400 can obtain a battery pack whose battery units 402 exhibit substantially the same state of charge level.

It will be apparent to those skilled in the art that various modifications, combinations and variations can be made in the present invention without departing from the spirit or scope of the invention. Specific embodiments, features and elements described herein may be modified, and/or combined in any suitable manner. Thus, it is intended that the present invention cover the modifications, combinations and variations of this invention provided they come within the scope of the appended claims and their equivalents.

What is claimed is:

1. An uninterrupted lithium battery power supply system comprising:
  a. a battery pack comprising:
    i. a first lithium battery unit comprising:
      1. a first lithium battery;
      2. a second lithium battery;
      each of said lithium batteries comprising:
        a. a positive terminal;
        b. a negative terminal;
      whereby said first and second lithium batteries are connected in series;

b. a power control system comprising:
  i. a battery power input;
  ii. an AC power input;
  iii. an AC power supply sensor;
  iv. a power output switch;
  v. a power output connector;
  vi. a computing device;
c. a battery unit balancing system comprising:
  i. a discharging circuit configured for connection to said battery unit comprising:
    1. a voltage dividing circuit;
    2. a comparator circuit comprising:
      a. a shunt regulator configured in parallel with said voltage divider;
    3. one or more current source circuits comprising:
      a. current regulator; and
      b. an output device;
  wherein said output device, said shunt regulator and said one or more current source circuits are connected in parallel with the battery unit, wherein, while connected to the battery unit, the discharging circuit is configured for automatic activation such that, when a voltage of the battery unit exceeds a predetermined threshold, the discharging circuit draws a constant discharging current from the battery unit until the voltage of the battery unit falls below the predetermined threshold;
  wherein the voltage dividing circuit is connected to the comparator circuit, via a node to the shunt regulator,
  said shunt regulator is connected to said current source circuit via a current limiting resistor of said output device,
  whereby the comparator circuit is activated to conduct when the voltage of the battery unit exceeds the predetermined threshold,
  the voltage dividing circuit is programmed to generate a predetermined voltage,
  wherein the predetermined voltage activates the one or more current source circuits via the comparator circuit,
  whereby each current source circuit of the one or more current source circuits is configured such that a substantially stable current flows independent of the voltage of the battery unit,
  whereby said uninterrupted lithium battery power supply system is configured to provide an uninterrupted power output;
  whereby said uninterrupted power output is provided by an AC power supply connected to said AC power input and, when there is an interruption in said AC power supply, by said battery pack, and
  whereby said power control system automatically controls said power output switch to draw power from said battery unit when an interruption in said AC power supply is detected by said AC power supply sensor.

2. The uninterrupted lithium battery power supply system of claim 1, wherein the voltage dividing circuit comprises one or more resisters that are programmed to generate the predetermined voltage.

3. The uninterrupted lithium battery power supply system of claim 1, wherein each current source circuit of the one or more current source circuits comprises:
  a. a first terminal connected between the battery unit and the balancing circuit, wherein said first terminal is connected to an emitter of a first transistor and a first terminal of a first resistor;
  b. a base of said first transistor connected to a second terminal of said first resistor and an emitter of a second transistor;
  c. a collector of said first transistor connected to a base of the second transistor; and
  d. a collector of said second transistor connected to said second terminal,
  wherein said second terminal is connected between said battery unit and said balancing circuit.

4. The uninterrupted lithium battery power supply system of claim 1, wherein the comparator circuit does not conduct when the voltage of the battery unit is below the predetermined threshold.

5. The uninterrupted lithium battery power supply system of claim 2, wherein each of the one or more current source circuits comprises one or more transistors and one or more resistors, wherein each current source circuit of the one or more current source circuits is configured such that the respective one or more transistors interact to form an equilibrium so that the stable current flows through the one or more resistors, thereby dissipating power.

6. The uninterrupted lithium battery power supply system of claim 1, wherein the predetermined threshold is about 3.7V.

7. The uninterrupted lithium battery power supply system of claim 1, further comprising a first output device for indicating the system is receiving power from the battery unit and a second output device for indicating the discharging circuit is activated.

8. The uninterrupted lithium battery power supply system of claim 1, wherein the voltage dividing circuit comprises:
  a. a first resistor having a first resistor value;
  b. a second resistor having a second resistor value; and
  c. a node between said first and second resistors connected to a shunt regulator,
    whereby the voltage dividing circuit provides a node voltage to the shunt regulator of the comparator circuit having a value equal to the product of the voltage of the battery and the second resistor value divided by the sum of first and second resistor values.

9. The uninterrupted lithium battery power supply system of claim 1, wherein at least one of the first and second resistors are variable resistors that can be adjusted to provide a node voltage to shunt regulator.

10. The uninterrupted lithium battery power supply system of claim 1, whereby when said comparator circuit is activated to conduct, said voltage dividing circuit divides the battery voltage by approximately ⅓ to produce a voltage of 1.2V when said battery unit reaches said predetermined threshold at which time said current source is activated.

11. The uninterrupted lithium battery power supply system of claim 1 further comprising:
  a. a battery monitoring module coupled to each of said plurality of lithium batteries, wherein each of said battery monitoring module comprises:
    i. a battery voltage sensor;
    ii. a module connector between a first battery monitoring module and a second battery monitoring module;
  b. a battery management system comprising:
    1. a battery data input coupled with said battery monitoring modules and said computing device;
    2. a data request output coupled with said battery monitoring modules and said computing device;
    3. a charging circuit coupled with first and second lithium batteries to provide a charging current from said AC power input when a voltage of one of said batteries drops below a threshold value;

wherein said first battery monitoring module is configured to, in response to a data request from said data request output of said computing device, transmit data of said first lithium battery to said battery data input and subsequently transmit a data request to said second battery monitoring module through said module connector; and wherein said second battery monitoring module is configured to, in response to said data request from the first battery monitoring module, transmit data of said second lithium battery to the battery data input of the computing device.

12. The uninterrupted lithium battery power supply system of claim 11, further comprising an output regulator coupled with a power supply and a power output connector, whereby said output regulator is configured to regulate said power supply a lower power level before being transmitted to said power output connector.

13. The uninterrupted lithium battery power supply system of claim 11, further comprising a data transmission system, whereby a set of data is configured to be transferred to an external location.

14. The uninterrupted lithium battery power supply system of claim 13, whereby the set of data comprises a voltage condition of the first and second lithium battery.

15. The uninterrupted lithium battery power supply system of claim 13, whereby a set of data comprises a power output condition of the said uninterrupted lithium battery power supply system.

16. The uninterrupted lithium battery power supply system of claim 13, whereby the data transmission system comprises a wireless signal transmitter for the transmission of a set of data to an external location.

17. The uninterrupted lithium battery power supply system of claim 11, comprising at least four lithium batteries connected in series.

18. The uninterrupted lithium battery power supply system of claim 11, wherein the battery data input comprises:
a. a signal receiver;
and the battery monitoring module comprises:
b. a wireless signal generator,
whereby said battery data input is configured to receive a wireless signal from said wireless signal generator.

19. The uninterrupted lithium battery power supply system of claim 12, wherein the data request output comprises:
a. a wireless signal generator;
and the battery monitoring module comprises:
b. a wireless signal receiver,
whereby said battery data input is configured to receive a wireless signal from said wireless signal generator.

20. The uninterrupted lithium battery power supply system of claim 11, wherein the battery monitoring module comprises an analog-to-digital converter that measures a voltage said batteries.

21. The uninterrupted lithium battery power supply system of claim 11, wherein the computing device is configured to transmit a second data request to the battery monitoring module couple to the first lithium battery, after said computing device has not received a data input through the battery data input for a predetermined period of time.

22. The uninterrupted lithium battery power supply system of claim 11, wherein the computing device is configured to shut off a battery charge when the computing device detects a high voltage condition across the first and second battery units.

* * * * *